United States Patent
Kato et al.

(10) Patent No.: US 8,797,148 B2
(45) Date of Patent: Aug. 5, 2014

(54) RADIO FREQUENCY IC DEVICE AND RADIO COMMUNICATION SYSTEM

(75) Inventors: Noboru Kato, Moriyama (JP); Nobuo Ikemoto, Moriyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 938 days.

(21) Appl. No.: 12/859,340

(22) Filed: Aug. 19, 2010

(65) Prior Publication Data

US 2010/0302013 A1  Dec. 2, 2010

Related U.S. Application Data

(63) Continuation of application No. PCT/JP2009/053690, filed on Feb. 27, 2009.

(30) Foreign Application Priority Data

| Mar. 3, 2008 | (JP) | ................................ 2008-052145 |
| Sep. 3, 2008 | (JP) | ................................ 2008-225468 |
| Sep. 9, 2008 | (JP) | ................................ 2008-231358 |

(51) Int. Cl.
   *G08C 17/02* (2006.01)
   *G06K 19/077* (2006.01)

(52) U.S. Cl.
   USPC ................. 340/10.51; 340/572.1; 340/572.5; 340/572.7; 235/492

(58) Field of Classification Search
   CPC . G06K 19/0723; H04B 5/0068; H04B 5/0062
   See application file for complete search history.

(56) References Cited

U.S. PATENT DOCUMENTS

| 3,364,564 A | 1/1968 | Kurtz et al. |
| 4,794,397 A | 12/1988 | Ohe et al. |

(Continued)

FOREIGN PATENT DOCUMENTS

| CA | 2 279 176 A1 | 7/1998 |
| DE | 10 2006 057 369 A1 | 6/2008 |

(Continued)

OTHER PUBLICATIONS

Official Communication issued in corresponding Japanese Patent Application No. 2009-536499, mailed on Sep. 11, 2012.

(Continued)

*Primary Examiner* — Benjamin C Lee
*Assistant Examiner* — Rajsheed Black-Childress
(74) *Attorney, Agent, or Firm* — Keating & Bennett, LLP

(57) ABSTRACT

A radio frequency IC device achieves impedance matching between a radio IC chip and a radiation plate in a wide frequency band, and achieves desired radiation characteristics over a wide range of frequencies. A radio frequency IC device and a radio communication system allow both long-distance and short-distance communication and, in particular, allow short-distance communication using a small amount of energy. The radio frequency IC device includes an electromagnetic coupling module including a radio IC chip and a feed circuit board, and a radiation plate. An annular electrode is arranged to be coupled to both a feed circuit of the electromagnetic coupling module and the radiation plate. The radiation plate defines an electric-field radiation plate for long-distance communication, while the annular electrode defines a magnetic-field radiation plate for short-distance communication. The feed circuit board may be removed, so that the radio IC chip is coupled to the annular electrode directly or with an interposer disposed therebetween.

32 Claims, 8 Drawing Sheets

(56) References Cited

U.S. PATENT DOCUMENTS

| | | |
|---|---|---|
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,572,226 A | 11/1996 | Tuttle |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,955,949 A * | 9/1999 | Cocita ................... 340/572.1 |
| 5,995,006 A | 11/1999 | Walsh |
| 6,104,311 A | 8/2000 | Lastinger |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,243,045 B1 | 6/2001 | Ishibashi |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,366,260 B1 * | 4/2002 | Carrender ................ 343/866 |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,956,481 B1 | 10/2005 | Cole |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,342,490 B2 * | 3/2008 | Herrmann et al. ......... 340/572.7 |
| 7,405,664 B2 | 7/2008 | Sakama et al. |
| 7,500,610 B1 * | 3/2009 | Hadley et al. ................ 235/451 |
| 7,551,141 B1 * | 6/2009 | Hadley et al. .......... 343/700 MS |
| 7,967,204 B2 * | 6/2011 | Hadley et al. ................ 235/451 |
| 8,026,818 B2 * | 9/2011 | Cote et al. ................ 340/572.7 |
| 2001/0011012 A1 | 8/2001 | Hino et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2002/0186004 A1 | 12/2002 | Prazeres da Costa et al. |
| 2003/0006901 A1 * | 1/2003 | Kim et al. ................. 340/572.5 |
| 2003/0020661 A1 | 1/2003 | Sato |
| 2003/0045324 A1 | 3/2003 | Nagumo et al. |
| 2003/0169153 A1 | 9/2003 | Muller |
| 2003/0206095 A1 | 11/2003 | Chaloner et al. |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0001031 A1 | 1/2005 | Akiho et al. |
| 2005/0007296 A1 | 1/2005 | Endo et al. |
| 2005/0024287 A1 * | 2/2005 | Jo et al. .................... 343/822 |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0133605 A1 | 6/2005 | Koyama et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0153755 A1 | 7/2005 | Suzuki et al. |
| 2005/0162331 A1 | 7/2005 | Endo et al. |
| 2005/0232412 A1 | 10/2005 | Ichihara et al. |
| 2005/0236623 A1 | 10/2005 | Takechi et al. |
| 2005/0253726 A1 | 11/2005 | Yoshida et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0044192 A1 | 3/2006 | Egbert |
| 2006/0055531 A1 | 3/2006 | Cook et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0114159 A1 | 6/2006 | Yoshikawa et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0208900 A1 | 9/2006 | Tavassoli Hozouri |
| 2006/0214801 A1 | 9/2006 | Murofushi et al. |
| 2006/0220871 A1 | 10/2006 | Baba et al. |
| 2006/0244568 A1 | 11/2006 | Tong et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0015549 A1 | 1/2007 | Hernandez et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200705 A1 | 8/2007 | Yamagajo et al. |
| 2007/0200782 A1 | 8/2007 | Hayama et al. |
| 2007/0229276 A1 | 10/2007 | Yamagajo et al. |
| 2007/0247387 A1 | 10/2007 | Kubo et al. |
| 2007/0252700 A1 | 11/2007 | Ishihara et al. |
| 2007/0252703 A1 | 11/2007 | Kato et al. |
| 2007/0252763 A1 | 11/2007 | Martin |
| 2007/0252770 A1 | 11/2007 | Kai et al. |
| 2007/0285335 A1 | 12/2007 | Bungo et al. |
| 2007/0290928 A1 | 12/2007 | Chang et al. |
| 2008/0018479 A1 * | 1/2008 | Hashimoto et al. ........ 340/572.8 |
| 2008/0024156 A1 | 1/2008 | Arai et al. |
| 2008/0068132 A1 | 3/2008 | Kayanakis et al. |
| 2008/0070003 A1 | 3/2008 | Nakatani et al. |
| 2008/0074268 A1 | 3/2008 | Shafer |
| 2008/0087990 A1 | 4/2008 | Kato et al. |
| 2008/0111694 A1 * | 5/2008 | Yamagajo et al. ......... 340/572.7 |
| 2008/0111695 A1 | 5/2008 | Yamagajo et al. |
| 2008/0129606 A1 | 6/2008 | Yanagisawa et al. |
| 2008/0143630 A1 | 6/2008 | Kato et al. |
| 2008/0169905 A1 | 7/2008 | Slatter |
| 2008/0184281 A1 | 7/2008 | Ashizaki et al. |
| 2008/0252551 A1 | 10/2008 | Kubo et al. |
| 2008/0272885 A1 | 11/2008 | Atherton |
| 2009/0002130 A1 | 1/2009 | Kato |
| 2009/0008460 A1 | 1/2009 | Kato |
| 2009/0009007 A1 | 1/2009 | Kato et al. |
| 2009/0021352 A1 | 1/2009 | Kataya et al. |
| 2009/0021446 A1 | 1/2009 | Kataya et al. |
| 2009/0065594 A1 | 3/2009 | Kato et al. |
| 2009/0066466 A1 | 3/2009 | Arimura |

(56) References Cited

U.S. PATENT DOCUMENTS

| | | | |
|---|---|---|---|
| 2009/0080296 A1 | 3/2009 | Dokai et al. | |
| 2009/0096696 A1 | 4/2009 | Joyce, Jr. et al. | |
| 2009/0109034 A1 | 4/2009 | Chen et al. | |
| 2009/0109102 A1 | 4/2009 | Dokai et al. | |
| 2009/0134979 A1 | 5/2009 | Tsukamoto et al. | |
| 2009/0140947 A1 | 6/2009 | Sasagawa et al. | |
| 2009/0146821 A1* | 6/2009 | Kato et al. | 340/572.7 |
| 2009/0160719 A1 | 6/2009 | Kato et al. | |
| 2009/0201116 A1 | 8/2009 | Orihara | |
| 2009/0224061 A1 | 9/2009 | Kato et al. | |
| 2009/0231106 A1 | 9/2009 | Okamura | |
| 2009/0262041 A1 | 10/2009 | Ikemoto et al. | |
| 2009/0266900 A1 | 10/2009 | Ikemoto et al. | |
| 2009/0278687 A1 | 11/2009 | Kato | |
| 2009/0284220 A1 | 11/2009 | Toncich et al. | |
| 2009/0321527 A1 | 12/2009 | Kato et al. | |
| 2010/0103058 A1 | 4/2010 | Kato et al. | |
| 2010/0182210 A1 | 7/2010 | Ryou et al. | |
| 2010/0283694 A1 | 11/2010 | Kato | |
| 2010/0308118 A1 | 12/2010 | Kataya et al. | |
| 2010/0328038 A1* | 12/2010 | Kato | 340/10.1 |
| 2011/0006119 A1* | 1/2011 | Honda | 235/492 |
| 2011/0031320 A1 | 2/2011 | Kato et al. | |
| 2011/0063184 A1 | 3/2011 | Furumura et al. | |
| 2011/0080331 A1 | 4/2011 | Kato | |
| 2011/0186641 A1 | 8/2011 | Kato et al. | |
| 2011/0253795 A1 | 10/2011 | Kato | |
| 2012/0001701 A1 | 1/2012 | Taniguchi et al. | |

FOREIGN PATENT DOCUMENTS

| | | | |
|---|---|---|---|
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 626 364 A2 | 2/2006 |
| EP | 1 701 296 A1 | 9/2006 |
| EP | 1 703 589 A1 | 9/2006 |
| EP | 1 742 296 A1 | 1/2007 |
| EP | 1 744 398 A1 | 1/2007 |
| EP | 1 840 802 A1 | 10/2007 |
| EP | 1 841 005 A1 | 10/2007 |
| EP | 1 865 574 A1 | 12/2007 |
| EP | 1 887 652 A1 | 2/2008 |
| EP | 1 976 056 A1 | 10/2008 |
| EP | 1 988 491 A1 | 11/2008 |
| EP | 1 988 601 A1 | 11/2008 |
| EP | 1 993 170 A1 | 11/2008 |
| EP | 2 009 738 A1 | 12/2008 |
| EP | 2 012 258 A1 | 1/2009 |
| EP | 2 096 709 A1 | 9/2009 |
| EP | 2 148 449 A1 | 1/2010 |
| EP | 2 166 617 A1 | 3/2010 |
| EP | 2 251 934 A1 | 11/2010 |
| EP | 2 256 861 A1 | 12/2010 |
| EP | 2 330 684 A1 | 6/2011 |
| GB | 2 305 075 A | 3/1997 |
| GB | 2461443 A | 1/2010 |
| GB | 2470299 A | 11/2010 |
| JP | 50-143451 A | 11/1975 |
| JP | 61-284102 A | 12/1986 |
| JP | 62-127140 U | 8/1987 |
| JP | 01-212035 A | 8/1989 |
| JP | 02-164105 A | 6/1990 |
| JP | 02-256208 A | 10/1990 |
| JP | 3-171385 A | 7/1991 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |
| JP | 04-134807 U | 12/1992 |
| JP | 05-226926 A | 9/1993 |
| JP | 05-327331 A | 12/1993 |
| JP | 6-53733 A | 2/1994 |
| JP | 06-077729 A | 3/1994 |
| JP | 06-029215 U | 4/1994 |
| JP | 06-177635 A | 6/1994 |
| JP | 6-260949 A | 9/1994 |
| JP | 07-183836 A | 7/1995 |
| JP | 08-055725 A | 2/1996 |
| JP | 08-056113 A | 2/1996 |
| JP | 8-87580 A | 4/1996 |
| JP | 08-88586 A | 4/1996 |
| JP | 08-088586 A | 4/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-093029 A | 4/1997 |
| JP | 09-245381 A | 9/1997 |
| JP | 09-252217 A | 9/1997 |
| JP | 09-270623 A | 10/1997 |
| JP | 09-284038 A | 10/1997 |
| JP | 09-294374 A | 11/1997 |
| JP | 9-512367 A | 12/1997 |
| JP | 10-069533 A | 3/1998 |
| JP | 10-69533 A | 3/1998 |
| JP | 10-084406 A | 3/1998 |
| JP | 10-505466 A | 5/1998 |
| JP | 10-171954 A | 6/1998 |
| JP | 10-173427 A | 6/1998 |
| JP | 10-193849 A | 7/1998 |
| JP | 10-193851 A | 7/1998 |
| JP | 10-242742 A | 9/1998 |
| JP | 10-293828 A | 11/1998 |
| JP | 10-334203 A | 12/1998 |
| JP | 11-025244 A | 1/1999 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149537 A | 6/1999 |
| JP | 11-149538 A | 6/1999 |
| JP | 11-175678 A | 7/1999 |
| JP | 11-219420 A | 8/1999 |
| JP | 11-220319 A | 8/1999 |
| JP | 11-282993 A | 10/1999 |
| JP | 11-328352 A | 11/1999 |
| JP | 11-331014 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-048152 A | 2/2000 |
| JP | 2000-059260 A | 2/2000 |
| JP | 2000-077928 A | 3/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |

(56) References Cited

FOREIGN PATENT DOCUMENTS

| | | |
|---|---|---|
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-043340 A | 2/2001 |
| JP | 3075400 U | 2/2001 |
| JP | 2001-66990 A | 3/2001 |
| JP | 2001-76111 A | 3/2001 |
| JP | 2001-084463 A | 3/2001 |
| JP | 2001-101369 A | 4/2001 |
| JP | 2001-505682 A | 4/2001 |
| JP | 2001-168628 A | 6/2001 |
| JP | 2001-188890 A | 7/2001 |
| JP | 2001-209767 A | 8/2001 |
| JP | 2001-240046 A | 9/2001 |
| JP | 2001-240217 A | 9/2001 |
| JP | 2001-256457 A | 9/2001 |
| JP | 2001-257292 A | 9/2001 |
| JP | 2001-514777 A | 9/2001 |
| JP | 2001-291181 A | 10/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351083 A | 12/2001 |
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-042083 A | 2/2002 |
| JP | 2002-063557 A | 2/2002 |
| JP | 2002-505645 A | 2/2002 |
| JP | 2002-076750 A | 3/2002 |
| JP | 2002-76750 A | 3/2002 |
| JP | 2002-111363 A | 4/2002 |
| JP | 2002-143826 A | 5/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-175920 A | 6/2002 |
| JP | 2002-183676 A | 6/2002 |
| JP | 2002-183690 A | 6/2002 |
| JP | 2002-185358 A | 6/2002 |
| JP | 2002-204117 A | 7/2002 |
| JP | 2002-521757 A | 7/2002 |
| JP | 2002-522849 A | 7/2002 |
| JP | 2002-222398 A | 8/2002 |
| JP | 2002-230128 A | 8/2002 |
| JP | 2002-232221 A | 8/2002 |
| JP | 2002-245416 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-290130 A | 10/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-324221 A | 11/2002 |
| JP | 2002-325013 A | 11/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-022912 A | 1/2003 |
| JP | 2003-026177 A | 1/2003 |
| JP | 2003-030612 A | 1/2003 |
| JP | 2003-037861 A | 2/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-108966 A | 4/2003 |
| JP | 2003-110344 A | 4/2003 |
| JP | 2003-132330 A | 5/2003 |
| JP | 2003-134007 A | 5/2003 |
| JP | 2003-139866 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-308363 A | 10/2003 |
| JP | 2003-309418 A | 10/2003 |
| JP | 2003-317055 A | 11/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-506905 A | 3/2004 |
| JP | 2004-104344 A | 4/2004 |
| JP | 2004-121412 A | 4/2004 |
| JP | 2004-126750 A | 4/2004 |
| JP | 2004-127230 A | 4/2004 |
| JP | 2004-140513 A | 5/2004 |
| JP | 2004-145449 A | 5/2004 |
| JP | 2004-163134 A | 6/2004 |
| JP | 2004-166175 A | 6/2004 |

(56) References Cited

FOREIGN PATENT DOCUMENTS

| | | |
|---|---|---|
| JP | 2004-166176 A | 6/2004 |
| JP | 2004-172919 A | 6/2004 |
| JP | 2004-213582 A | 7/2004 |
| JP | 2004-519916 A | 7/2004 |
| JP | 2004/070879 A | 8/2004 |
| JP | 2004-234595 A | 8/2004 |
| JP | 2004-253858 A | 9/2004 |
| JP | 2004-527864 A | 9/2004 |
| JP | 2004-280390 A | 10/2004 |
| JP | 2004-282403 A | 10/2004 |
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-336604 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-006096 A | 1/2005 |
| JP | 2005-18156 A | 1/2005 |
| JP | 2005-033461 A | 2/2005 |
| JP | 2005-050581 A | 2/2005 |
| JP | 2005-064799 A | 3/2005 |
| JP | 2005-124061 A | 5/2005 |
| JP | 2005-128592 A | 5/2005 |
| JP | 2005-129019 A | 5/2005 |
| JP | 2005-134942 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-192124 A | 7/2005 |
| JP | 2005-202943 A | 7/2005 |
| JP | 2005-203877 A | 7/2005 |
| JP | 2005-204038 A | 7/2005 |
| JP | 2005-210223 A | 8/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-277579 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-306696 A | 11/2005 |
| JP | 2005-311205 A | 11/2005 |
| JP | 2005-321305 A | 11/2005 |
| JP | 2005-322119 A | 11/2005 |
| JP | 2005-327622 A | 11/2005 |
| JP | 2005-328259 A | 11/2005 |
| JP | 2005-333244 A | 12/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-013976 A | 1/2006 |
| JP | 2006-13976 A | 1/2006 |
| JP | 2006-025390 A | 1/2006 |
| JP | 2006-031766 A | 2/2006 |
| JP | 2006-033298 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-050200 A | 2/2006 |
| JP | 2006-053833 A | 2/2006 |
| JP | 2006-67479 A | 3/2006 |
| JP | 2006-72706 A | 3/2006 |
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-238282 A | 9/2006 |
| JP | 2006-246372 A | 9/2006 |
| JP | 2006-270212 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-013120 A | 1/2007 |
| JP | 2007-13120 A | 1/2007 |
| JP | 2007-18067 A | 1/2007 |
| JP | 2007-018518 A | 1/2007 |
| JP | 2007-019905 A | 1/2007 |
| JP | 2007-28002 A | 2/2007 |
| JP | 2007-028002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-068073 A | 3/2007 |
| JP | 2007-79687 A | 3/2007 |
| JP | 2007-81712 A | 3/2007 |
| JP | 2007-096655 A | 4/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-149757 A | 6/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-166133 A | 6/2007 |
| JP | 3975918 B2 | 6/2007 |
| JP | 2007-172369 A | 7/2007 |
| JP | 2007-172527 A | 7/2007 |
| JP | 2007-194924 A | 8/2007 |
| JP | 2007-524942 A | 8/2007 |
| JP | 2007-228254 A | 9/2007 |
| JP | 2007-228325 A | 9/2007 |
| JP | 2007-228437 A | 9/2007 |
| JP | 2007-233597 A | 9/2007 |
| JP | 2007-241789 A | 9/2007 |
| JP | 2007-249620 A | 9/2007 |
| JP | 2007-266999 A | 10/2007 |

(56) References Cited

FOREIGN PATENT DOCUMENTS

| | | |
|---|---|---|
| JP | 2007-272264 A | 10/2007 |
| JP | 2007-279782 A | 10/2007 |
| JP | 2007-287128 A | 11/2007 |
| JP | 2007-295177 A | 11/2007 |
| JP | 2007-295395 A | 11/2007 |
| JP | 2007-295557 A | 11/2007 |
| JP | 2007-312350 A | 11/2007 |
| JP | 2007-324865 A | 12/2007 |
| JP | 2008-033716 A | 2/2008 |
| JP | 2008-042910 A | 2/2008 |
| JP | 2008-72243 A | 3/2008 |
| JP | 2008-083867 A | 4/2008 |
| JP | 2008-092131 A | 4/2008 |
| JP | 2008-097426 A | 4/2008 |
| JP | 2008-098993 A | 4/2008 |
| JP | 4069958 B2 | 4/2008 |
| JP | 2008-103691 A | 5/2008 |
| JP | 2008-107947 A | 5/2008 |
| JP | 2008-118359 A | 5/2008 |
| JP | 2008-513888 A | 5/2008 |
| JP | 2008-148345 A | 6/2008 |
| JP | 2008-519347 A | 6/2008 |
| JP | 2008-160821 A | 7/2008 |
| JP | 2008-160874 A | 7/2008 |
| JP | 2008-167190 A | 7/2008 |
| JP | 2008-182438 A | 8/2008 |
| JP | 2008-197714 A | 8/2008 |
| JP | 2008-535372 A | 8/2008 |
| JP | 2008-207875 A | 9/2008 |
| JP | 2008-211572 A | 9/2008 |
| JP | 2008-217406 A | 9/2008 |
| JP | 2008-226099 A | 9/2008 |
| JP | 2008-244739 A | 10/2008 |
| JP | 2008-252517 A | 10/2008 |
| JP | 2008-288915 A | 11/2008 |
| JP | 2008-294491 A | 12/2008 |
| JP | 2009-017284 A | 1/2009 |
| JP | 2009-021970 A | 1/2009 |
| JP | 2009-25870 A | 2/2009 |
| JP | 2009-027291 A | 2/2009 |
| JP | 2009-27291 A | 2/2009 |
| JP | 2009-037413 A | 2/2009 |
| JP | 2009-044647 A | 2/2009 |
| JP | 2009-044715 A | 2/2009 |
| JP | 3148168 U | 2/2009 |
| JP | 2009-065426 A | 3/2009 |
| JP | 2009-110144 A | 5/2009 |
| JP | 2009-111986 A | 5/2009 |
| JP | 2009-130896 A | 6/2009 |
| JP | 2009-135166 A | 6/2009 |
| JP | 2009-524363 A | 6/2009 |
| JP | 2009-153166 A | 7/2009 |
| JP | 4301346 B2 | 7/2009 |
| JP | 2009-181246 A | 8/2009 |
| JP | 2009-182630 A | 8/2009 |
| JP | 2009-213169 A | 9/2009 |
| JP | 2009-213171 A | 9/2009 |
| JP | 2009-260758 A | 11/2009 |
| JP | 2009-278441 A | 11/2009 |
| JP | 2009-284182 A | 12/2009 |
| JP | 2010-009196 A | 1/2010 |
| JP | 2010-015342 A | 1/2010 |
| JP | 2010-504598 A | 2/2010 |
| JP | 2010-050844 A | 3/2010 |
| JP | 2010-051012 A | 3/2010 |
| JP | 2010-051017 A | 3/2010 |
| JP | 2010-074839 A | 4/2010 |
| JP | 2010-081571 | 4/2010 |
| JP | 2010-171857 A | 8/2010 |
| JP | 4535209 B2 | 9/2010 |
| JP | 4561932 B2 | 10/2010 |
| JP | 2010-268306 A | 11/2010 |
| JP | 2011-015395 A | 1/2011 |
| JP | 4609604 B2 | 1/2011 |
| JP | 2011-076567 A | 4/2011 |
| JP | 2011-139533 A | 7/2011 |
| JP | 2011-205384 A | 10/2011 |
| JP | 2012-033021 A | 2/2012 |
| NL | 9100176 | 3/1992 |
| NL | 9100347 A | 3/1992 |
| WO | 98/33142 A1 | 7/1998 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/036772 A2 | 4/2004 |
| WO | 2004/070879 A | 8/2004 |
| WO | 2004/072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/049068 A1 | 5/2006 |
| WO | 2006/114821 A1 | 11/2006 |
| WO | 2007/013168 A1 | 2/2007 |
| WO | 2007/017944 A1 | 2/2007 |
| WO | 2007/054900 A2 | 5/2007 |
| WO | 2007/060792 A1 | 5/2007 |
| WO | 2007/083574 A1 | 7/2007 |
| WO | 2007/083575 A1 | 7/2007 |
| WO | 2007/086130 A1 | 8/2007 |
| WO | 2007/094494 A1 | 8/2007 |
| WO | 2007/096789 A1 | 8/2007 |
| WO | 2007/097385 A1 | 8/2007 |
| WO | 2007/099602 A1 | 9/2007 |
| WO | 2007/100092 A1 | 9/2007 |
| WO | 2007/102360 A1 | 9/2007 |
| WO | 2007/105348 A1 | 9/2007 |
| WO | 2007/119310 A1 | 10/2007 |
| WO | 2007/125683 A1 | 11/2007 |
| WO | 2007/132094 A1 | 11/2007 |
| WO | 2007/138857 A1 | 12/2007 |
| WO | 2008/001561 A1 | 1/2008 |
| WO | 2008/007606 A | 1/2008 |
| WO | 2008/081699 A1 | 7/2008 |
| WO | 2008/126458 A1 | 10/2008 |
| WO | 2008/133018 A1 | 11/2008 |
| WO | 2008/140037 A1 | 11/2008 |
| WO | 2008/142957 A1 | 11/2008 |
| WO | 2009/005080 A1 | 1/2009 |
| WO | 2009/008296 A1 | 1/2009 |
| WO | 2009/011144 A1 | 1/2009 |
| WO | 2009/011154 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/048767 A1 | 4/2009 |
| WO | 2009/081719 A1 | 7/2009 |
| WO | 2009/110381 A1 | 9/2009 |
| WO | 2009/119548 A1 | 10/2009 |
| WO | 2009/128437 A1 | 10/2009 |
| WO | 2009/140220 A1 | 11/2009 |
| WO | 2009/142114 A1 | 11/2009 |
| WO | 2010/026939 A1 | 3/2010 |
| WO | 2010/050361 A1 | 5/2010 |
| WO | 2010/079830 A1 | 7/2010 |
| WO | 2010/104179 A1 | 9/2010 |
| WO | 2010/119854 A1 | 10/2010 |
| WO | 2011/062274 A1 | 5/2011 |

OTHER PUBLICATIONS

Official Communication issued in corresponding European Patent Application No. 09718502.9, mailed on Aug. 10, 2012.
Official Communication issued in corresponding Japanese Patent Application No. 2009-536499, mailed on Jun. 5, 2012.
Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.

(56) References Cited

OTHER PUBLICATIONS

Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.
Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, mailed on Feb. 15, 2011.
Ito: "Wireless IC Device and Method of Detecting Environmental State Using the Device"; U.S. Appl. No. 13/421,889, filed Mar. 16, 2012.
Official Communication issued in International Patent Application No. PCT/JP2011/053654, mailed on Mar. 29, 2011.
Kato et al.: "Antenna Device and Mobile Communication Terminal"; U.S. Appl. No. 13/425,505, filed Mar. 21, 2012.
Official Communication issued in International Patent Application No. PCT/JP2010/069416, mailed on Feb. 8, 2011.
Kato et al.: "Wireless Communication Device and Metal Article"; U.S. Appl. No. 13/429,465, filed Mar. 26, 2012.
Official Communication issued in International Patent Application No. PCT/JP2011/055344, mailed on Jun. 14, 2011.
Kubo et al.: "Antenna and Mobile Terminal"; U.S. Appl. No. 13/452,972, filed Apr. 23, 2012.
Ikemoto: "RFID System"; U.S. Appl. No. 13/457,525, filed Apr. 27, 2012.
Ikemoto et al.: "Wireless IC Device and Electronic Apparatus"; U.S. Appl.No. 13/468,058, filed May 10, 2012.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.
Official Communication issued in International Patent Application No. PCT/JP2010/056812, mailed on Jul. 13, 2010.
Dokai et al.: "Optical Disc"; U.S. Appl. No. 13/295,153, filed Nov. 14, 2011.
Official Communication issued in International Patent Application No. PCT/JP2010/057668, mailed on Aug. 17, 2010.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, mailed on Dec. 7, 2010.
Kato: "Wireless IC Device and Coupling Method for Power Feeding Circuit and Radiation Plate"; U.S. Appl. No. 13/325,273, filed Dec. 14, 2011.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato: "Composite Antenna," U.S. Appl. No. 12/845,846, filed Jul. 29, 2010.
Official Communiation issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device" U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.

(56) References Cited

OTHER PUBLICATIONS

Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module," U.S. Appl. No. 12/536,663, filed Aug. 6, 2009.
Osamura et al.: "Packaging Material With Electromagnetic Coupling Module," U.S. Appl. No. 12/536,669, filed Aug. 6, 2009.
Dokai et al.: "Wireless IC Device and Component for Wireless IC Device," U.S. Appl. No. 12/543,553, filed Aug. 19, 2009.
Shioya et al.: "Wireless IC Device," U.S. Appl. No. 12/551,037, filed Aug. 31, 2009.
Ikemoto: "Wireless IC Device and Manufacturing Method Thereof," U.S. Appl. No. 12/579,672, filed Oct. 15, 2009.
Official communication issued in International Application No. PCT/JP2008/058614, mailed on Jun. 10, 2008.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags")", RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., Ltd, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
English translation of NL9100176, published on Mar. 2, 1992.

English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/530,307, filed Jan. 8, 2009.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.

(56) References Cited

OTHER PUBLICATIONS

Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus," U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.
Official Communication issued in International Patent Application No. PCT/JP2010/066291, mailed on Dec. 28, 2010.
Ikemoto: "Communication Terminal and Information Processing System"; U.S. Appl. No. 13/432,002, filed Mar. 28, 2012.
Official Communication issued in International Patent Application No. PCT/JP2010/070767, mailed on Feb. 22, 2011.
Ieki et al.: "Transceiver and Radio Frequency Identification Tag Reader"; U.S. Appl. No. 13/437,978, filed Apr. 3, 2012.
Official Communication issued in International Patent Application No. PCT/JP2011/065431, mailed on Oct. 18, 2011.
Kato et al.: "Wireless IC Device"; U.S. Appl. No. 13/470,486, filed May 14, 2012.
Kato: "Wireless IC Device"; U.S. Appl. No. 12/789,610, filed May 28, 2010.
Kato: "Antenna and RFID Device"; U.S. Appl. No. 13/472,520, filed May 16, 2012.
Kato et al.: "Wireless IC Device and Component for Wireless IC Device"; U.S. Appl. No. 13/540,694, filed Jul. 3, 2012.
Dokai et al.: "Wireless IC Device and Component for Wireless IC Device"; U.S. Appl. No. 13/567,108, filed Aug. 6, 2012.
Dokai et al.: "Wireless IC Device and Compenent for Wireless IC Device"; U.S. Appl. No. 13/567,109, filed Aug. 6, 2012.
Official Communication issued in International Patent Application No. PCT/JP2011/052594, mailed on May 17, 2011.
Kato et al.: "Wireless IC Device"; U.S. Appl. No. 13/585,866, filed Aug. 15, 2012.
Kato et al.: "Radio Communication Device and Radio Communication Terminal"; U.S. Appl. No. 13/600,256, filed Aug. 31, 2012.
Murayama et al.: "Wireless Communication Module and Wireless Communication Device"; U.S. Appl. No. 13/598,872, filed Aug. 30, 2012.
Official Communication issued in International Patent Application No. PCT/JP2011/069689, mailed on Oct. 4, 2011.
Official Communication issued in corresponding Japanese Patent Application No. 2011-552116, mailed on Apr. 17, 2012.
Tsubaki et al.: "RFID Module and RFID Device"; U.S. Appl. No. 13/603,627, filed Sep. 5, 2012.
Kato et al.: "Antenna Device and Method of Setting Resonant Frequency of Antenna Device"; U.S. Appl. No. 13/604,807, filed Sep. 6, 2012.
Kato et al.: "Antenna Device and Method of Setting Resonant Frequency of Antenna Device"; U.S. Appl. No. 13/604,801, filed Sep. 6, 2012.
Official Communication issued in International Patent Application No. PCT/JP2011/053656, mailed on May 17, 2011.
Official Communication issued in International Patent Application No. PCT/JP2011/068110, mailed on Sep. 20, 2011.
Dokai et al.: "Antenna and Wireless Communication Device"; U.S. Appl. No. 13/613,021, filed Sep. 13, 2012.
Takeoka et al.: "Printed Wiring Board and Wireless Communication System"; U.S. Appl. No. 13/616,140, filed Sep. 14, 2012.
Dokai: "Wireless IC Device, Wireless IC Module and Method of Manufacturing Wireless IC Module"; U.S. Appl. No. 13/688,287, filed Nov. 29, 2012.
Official Communication issued in International Patent Application No. PCT/JP2011/067127, mailed on Oct. 18, 2011.
Kato et al.: "Wireless Communication Device and Metal Article"; U.S. Appl. No. 13/691,996, filed Dec. 3, 2012.
Yosui: "Antenna Apparatus and Communication Terminal Instrument"; U.S. Appl. No. 13/706,409, filed Dec. 6, 2012.
Official Communication issued in International Patent Application No. PCT/JP2011/071795, mailed on Dec. 27, 2011.
Dokai et al.: "Wireless IC Device"; U.S. Appl. No. 13/738,143, filed on Jan. 10, 2013.
Official Communication issued in International Patent Application No. PCT/JP2011/074009, mailed on Dec. 20, 2011.
Kato et al.: "Electromagnetic-Coupling-Module-Attached Article"; U.S. Appl. No.13/754,972, filed Jan. 31, 2013.
Kimura et al.: "Electrical Product"; U.S. Appl. No. 13/757,991, filed Feb. 4, 2013.
Nakano et al.: "Communication Terminal Device"; U.S. Appl. No. 13/760,196, filed Feb. 6, 2013.
Official Communication issued in International Patent Application No. PCT/JP2011/073054, mailed on Dec. 20, 2011.
Official Communication issued in International Patent Application No. PCT/JP2011/073490, mailed on Jan. 10, 2012.
Kato et al.: "Antenna Device and Communication Terminal Apparatus"; U.S. Appl. No. 13/761,195, filed Feb. 7, 2013.
Kato et al.: "Antenna Device and Mobile Communication Terminal"; U.S. Appl. No. 13/767,960, filed Feb. 15, 2013.
Official Communication issued in International Patent Application No. PCT/JP2012/058884, mailed on Jun. 12, 2012.
Dokai et al.: "Wireless Communication Device"; U.S. Appl. No. 13/782,346, filed Mar. 1, 2013.
Official Communication issued in International Patent Application No. PCT/JP2012/053344, mailed on May 22, 2012.
Official Communication issued in International Patent Application No. PCT/JP2012/050557, mailed on Apr. 10, 2012.
Kimura et al.: "Wireless Communication Device"; U.S. Appl. No. 13/789,761, filed Mar. 8, 2013.
Dokai et al.: "RFID Chip Package and RFID Tag"; U.S. Appl. No. 13/792,650, filed Mar. 11, 2013.
Kato et al.: "Wireless IC Device Component and Wireless IC Device"; U.S. Appl. No. 13/794,929, filed Mar. 12, 2013.
Kato et al.: "Wireless IC Device and Component for Wireless IC Device"; U.S. Appl. No. 13/848,748, filed Mar. 22, 2013.
Official Communication issued in International Patent Application No. PCT/JP2010/080493, mailed on Dec. 25, 2012.
Mukai et al.: "Inspection Method and Inspection Device for RFID Tag"; U.S. Appl. No. 13/933,184, filed Jul. 2, 2013.
Kato et al.: "Antenna Device and Method of Setting Resonant Frequency of Antenna Device"; U.S. Appl. No. 13/941,760, filed Jul. 15, 2013.
Kato et al.: "Antenna Device and Method of Setting Resonant Frequency of Antenna Device"; U.S. Appl. No. 13/943,973, filed Jul. 17, 2013.
Official Communication issued in International Patent Application No. PCT/JP2012/080700, mailed on Jan. 15, 2013.
Mukai et al.: "Wireless Integrated Circuit Device and Method of Manufacturing the Same"; U.S. Appl. No. 13/961,995, filed Aug. 8, 2013.
Kato et al.: "Radio IC Device"; U.S. Appl. No. 13/964,234, filed Aug. 12, 2013.
Official Communication issued in International Patent Application No. PCT/JP2012/067779, mailed on Aug. 28, 2012.
Official Communication issued in International Patent Application No. PCT/JP2013/051254, mailed on Apr. 2, 2013.

(56) References Cited

OTHER PUBLICATIONS

Dokai: "Wireless Communication Device"; U.S. Appl. No. 13/970,633, filed Aug. 20, 2013.
Official Communication issued in International Patent Application No. PCT/JP2012/059350, mailed on Jul. 3, 2012.
Dokai: "Wireless IC Device"; U.S. Appl. No. 14/011,823, filed Aug. 28, 2013.
Official Communication issued in International Patent Application No. PCT/JP2012/055505, mailed on Jun. 5, 2012.
Kato: "Radio IC Device and Radio Communication Terminal"; U.S. Appl. No. 14/017,406, filed Sep. 4, 2013.
Official Communication issued in International Patent Application No. PCT/JP2012/067454, mailed on Aug. 7, 2012.
Kato: "Antenna Device and Communication Terminal Apparatus"; U.S. Appl. No. 14/019,573, filed Sep. 6, 2013.
Official Communication issued in International Patent Application No. PCT/JP2012/067537, mailed on Oct. 9, 2012.
Kato: "Radio Communication Device"; U.S. Appl. No. 14/027,384, filed Sep. 16, 2013.
Kato: "Antenna Device, RFID Tag, and Communication Terminal Apparatus"; U.S. Appl. No. 14/031,270, filed Sep. 19, 2013.
Kato et al.: Wireless IC Device; U.S. Appl. No. 14/054,865, filed Oct. 16, 2013.

* cited by examiner

RADIO FREQUENCY IC DEVICE AND RADIO COMMUNICATION SYSTEM

BACKGROUND OF THE INVENTION

1. Field of the Invention

The present invention relates to radio frequency IC devices, and particularly to a radio frequency IC device used in a radio frequency identification (RFID) system and a radio communication system including the radio frequency IC device.

2. Description of the Related Art

Conventionally, RFID systems have been developed as article management systems. An RFID system allows non-contact communication between a reader/writer that generates an induction field and an IC chip (also referred to as an IC tag or a radio IC chip) that stores predetermined information and is attached to an article or a container, and thereby allows transmission of information therebetween. The IC chip is capable of communicating with the reader/writer when connected to an antenna, that is, to a radiation plate. A tag antenna disclosed in Japanese Unexamined Patent Application Publication No. 2006-295879 has been conventionally known as one for mounting an IC chip thereon.

This tag antenna has portions of large line width at both ends of a dipole antenna. Mounting an LSI chip on a feeder unit at the center of the dipole antenna allows the tag antenna to function as an RFID system. An inductance unit is disposed around the feeder unit and provides impedance matching between the LSI chip and the dipole antenna.

In the tag antenna described above, only the inductance unit performs impedance matching between the LSI chip and the dipole antenna. This may cause problems in that a frequency range in which impedance matching can be achieved is narrow, an LSI chip having a different impedance cannot be supported, variations in manufacture of inductance units may cause variations in frequency of signals that can be transmitted and received, and thus the tag antenna does not operate as an RFID system.

In the tag antenna disclosed in Japanese Unexamined Patent Application Publication No. 2006-295879, the size of the dipole antenna is reduced by forming, at both ends of the dipole antenna, regions wider than the line width of a dipole portion of the dipole antenna. However, the size reduction of the antenna causes degradation in signal radiation characteristics, and narrows the frequency range in which a desired radiation gain can be achieved.

The present inventors have focused attention on the point that it is necessary for an IC chip of this type to appropriately perform both long-distance communication and short-distance communication. This is because although information is usually exchanged through long-distance communication, specific information may preferably be exchanged only through short-distance communication. For example, in the stage of manufacturing IC chips, when a plurality of IC chips arranged in close proximity are assigned IDs or subjected to characteristic testing, it is necessary that only a specific IC chip be distinguished from adjacent IC chips and allowed to communicate with a reader/writer within a short distance only.

Japanese Unexamined Patent Application Publication No. 2007-79687 discloses a method for testing an RFID tag. The RFID tag includes an antenna that performs communication at UHF-band frequencies and a matching circuit that adjusts impedance of the antenna. For testing the RFID tag, an antenna coil of a reader/writer is placed near the matching circuit of the RFID tag, so that a magnetic flux from the antenna coil causes a control circuit of the RFID tag to operate and thus the RFID tag can be tested.

However, in this RFID tag, the size of the matching circuit is substantially determined by the impedance of an IC. Since it is difficult to increase an area where the magnetic flux crosses, a distance along which the control circuit of the RFID tag can be operated is small.

Japanese Unexamined Patent Application Publication No. 2003-168760 discloses an interposer that firmly electrically connects a substrate having an IC chip mounted thereon to a conductive connecting part of another electrical circuit.

SUMMARY OF THE INVENTION

A preferred embodiment of the present invention provides a radio frequency IC device capable of achieving impedance matching between a radio IC and a radiation plate in a wide frequency band, and achieving desired radiation characteristics over a wide range of frequencies.

Another preferred embodiment of the present invention provides a simple manufacturing process for manufacturing a radio frequency IC device that achieves impedance matching between a radio IC and a radiation plate in a wide frequency band, and achieves desired radiation characteristics over a wide range of frequencies.

A further preferred embodiment of the present invention provides a radio frequency IC device and a radio communication system that allow both long-distance and short-distance communication and, in particular, allow short-distance communication using a small amount of energy.

A radio frequency IC device according to a preferred embodiment of the present invention includes a radio IC; an annular electrode coupled to the radio IC and including at least a pair of end portions; and a dipole radiation plate coupled to the annular electrode.

A radio frequency IC device according to another preferred embodiment of the present invention includes a radio IC; an interposer coupled to the radio IC and including a line electrode disposed on at least one principal surface of a base and/or inside the base; an annular electrode including at least a pair of end portions; and a dipole radiation plate coupled to the annular electrode. The line electrode is coupled to at least one of the annular electrode and the radiation plate.

A radio frequency IC device according to a further preferred embodiment of the present invention includes a radio IC; a feed circuit coupled to the radio IC, and constituted by a resonant circuit including an inductance element and having a predetermined resonant frequency; an annular electrode including at least a pair of end portions and electromagnetically coupled to the feed circuit at the pair of end portions; and a dipole radiation plate coupled to the annular electrode.

A radio frequency IC device according to another preferred embodiment of the present invention includes a radio IC; a magnetic-field radiation plate coupled to the radio IC and including at least a pair of end portions; and an electric-field radiation plate coupled to the magnetic-field radiation plate.

A radio frequency IC device according to an additional preferred embodiment of the present invention includes a radio IC; an interposer coupled to the radio IC and including a line electrode disposed on at least one principal surface of a base and/or inside the base; a magnetic-field radiation plate including at least a pair of end portions; and an electric-field radiation plate coupled to the magnetic-field radiation plate. The line electrode is coupled to at least one of the magnetic-field radiation plate and the electric-field radiation plate.

A radio frequency IC device according to another preferred embodiment of the present invention includes a radio IC; a feed circuit coupled to the radio IC, and constituted by a resonant circuit including an inductance element and having a predetermined resonant frequency; a magnetic-field radiation plate including at least a pair of end portions and electromagnetically coupled to the feed circuit at the pair of end portions; and an electric-field radiation plate coupled to the magnetic-field radiation plate.

A radio communication system according to yet another preferred embodiment of the present invention includes a radio frequency IC device according to any one of the preferred embodiments of the present invention described above, and a reader/writer configured to communicate with the radio frequency IC device. The reader/writer includes a magnetic-field radiation plate constituted by an annular electrode.

In the radio frequency IC device according to one of the preferred embodiments of the present invention described above, a frequency of a signal used in communicating with a reader/writer is substantially determined by the feed circuit constituted by the resonant circuit having a predetermined resonant frequency. By designing the feed circuit in accordance with the impedances of the radio IC and radiation plate to be used, it is possible to support various impedances. Additionally, by arranging the annular electrode such that it is coupled to the feed circuit and the dipole radiation plate, it is possible to reduce loss of a signal transmitted from the annular electrode to the radiation plate, and thus to improve signal radiation characteristics.

Thus, the feed circuit board including the feed circuit may be removed to allow the radiation plate to function as a resonant circuit. In addition, an interposer may be disposed between the radio IC and the annular electrode.

In the radio frequency IC device of the one of the preferred embodiments of the present invention described above, the magnetic-field radiation plate allows short-distance communication, while the electric-field radiation plate allows long-distance communication. When impedance matching is performed in the resonant circuit, the magnetic-field radiation plate can be relatively freely designed regardless of impedance matching, and it is possible to secure a large area where a magnetic flux crosses. As a result, it becomes possible to perform short-distance communication with a reader/writer using a small amount of energy.

According to various preferred embodiments of the present invention, since the annular electrode is provided, it is possible to achieve desired radiation characteristics over a wide range of frequencies. Moreover, since the magnetic-field radiation plate allows short-distance communication and the electric-field radiation plate allows long-distance communication, it is possible to appropriately perform both short-distance and long-distance communication by using the magnetic-field radiation plate and the electric-field radiation plate. Since the magnetic-field radiation plate can have a large area where a magnetic flux crosses regardless of impedance matching, it is possible to perform short-distance communication with a reader/writer using a small amount of energy.

By using the resonant circuit included in the feed circuit, it is possible to widen a frequency band where impedance matching between the radio IC and the radiation plate can be achieved. Additionally, when an interposer is disposed between the radio IC and the annular electrode, the interposer on which a very small radio IC is mounted can be mounted on the annular electrode through a simple process.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
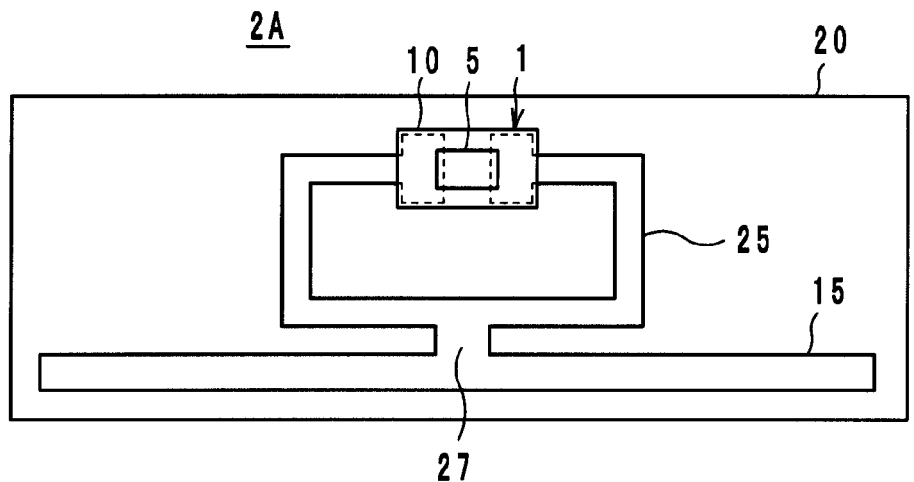
FIG. 1A to FIG. 1C are plan views illustrating a radio frequency IC device according to a first preferred embodiment of the present invention.

Hereinafter, preferred embodiments of a radio frequency IC device and a radio communication system according to the present invention will be described with reference to the attached drawings. In the drawings, like components and parts are given the same reference numerals, and redundant description will be omitted.

First Preferred Embodiment (FIG. 1A to FIG. 5)

Figure 1B:
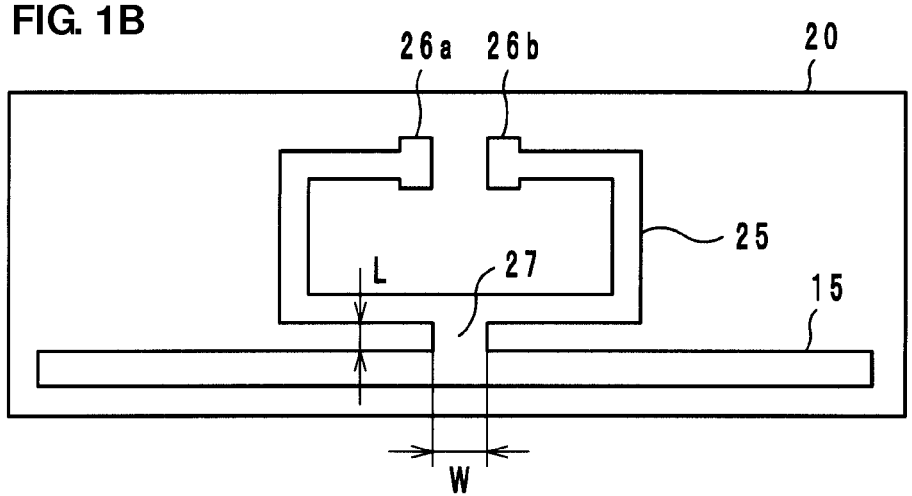
Figure 1C:
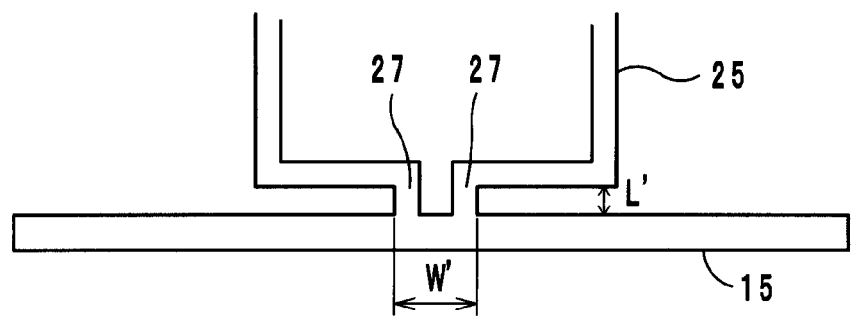

FIGS. 1A-1C illustrate a radio frequency IC device 2A according to a first preferred embodiment of the present invention. The radio frequency IC device 2A includes an electromagnetic coupling module 1, a radiation plate 15, and an annular electrode 25. The electromagnetic coupling module 1 includes a radio IC chip 5 that processes transmission/reception signals of predetermined frequencies, and a feed circuit board 10 on which the radio IC chip 5 is mounted. The radiation plate 15 and the annular electrode 25 are formed on a base 20, such as a PET film, for example.

FIG. 1A illustrates the radio frequency IC device in a state in which the electromagnetic coupling module 1 is mounted. FIG. 1B illustrates the radiation plate 15 and the annular electrode 25 in a state where the electromagnetic coupling module 1 is not mounted. FIG. 1C illustrates a modification of a connecting portion 27 between the radiation plate 15 and the annular electrode 25.

The radiation plate 15 preferably has a so-called dipole shape, and is arranged to extend on both sides of the electromagnetic coupling module 1. The annular electrode 25 includes a pair of wide end portions 26a and 26b on which the electromagnetic coupling module 1 is mounted. A portion of the annular electrode 25 is electrically connected to the radiation plate 15 through the connecting portion 27. The radiation plate 15 and the annular electrode 25 may be defined by attaching a conductive metal sheet, such as a sheet of aluminum foil or copper foil, to the base 20 and patterning the conductive metal sheet. Alternatively, the radiation plate 15 and the annular electrode 25 may be defined by producing a film by plating or applying conductive paste, such as Al, Cu, or Ag paste, to the base 20 and patterning the film.

Figure 2:
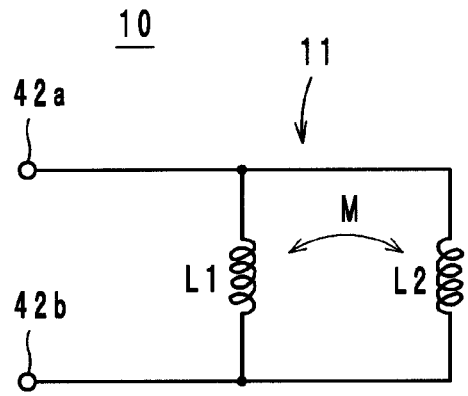
FIG. 2 is an equivalent circuit diagram illustrating a feed circuit of the radio frequency IC device according to the first preferred embodiment of the present invention.

As illustrated as an equivalent circuit in FIG. 2, the feed circuit board 10 includes a feed circuit 11 (which will be described in detail below with reference to FIG. 5) including a resonant and matching circuit including inductance elements L1 and L2. The inductance elements L1 and L2 have different inductance values and are magnetically coupled to each other (as indicated by mutual inductance M) in opposite phases.

Figure 3:
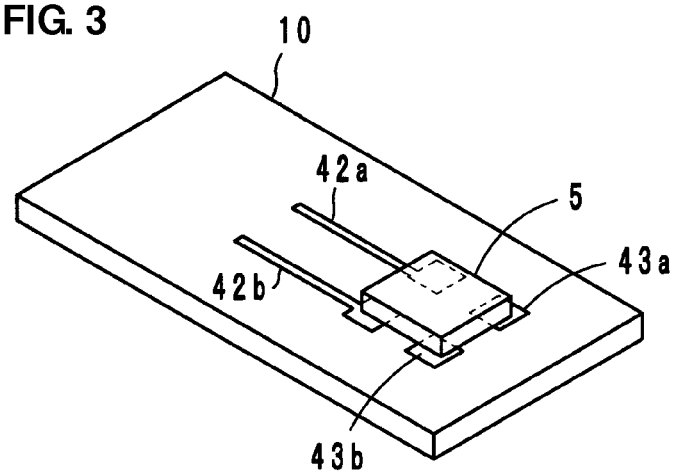
FIG. 3 is a perspective view illustrating a state in which a radio IC chip is mounted on a feed circuit board included in the radio frequency IC device according to the first preferred embodiment of the present invention.

The radio IC chip 5 includes a clock circuit, a logic circuit, a memory circuit, etc., and stores necessary information. While not shown, a pair of input/output terminal electrodes and a pair of mounting terminal electrodes are disposed on the back side of the radio IC chip 5. As illustrated in FIG. 3, the input/output terminal electrodes are electrically connected through metal bumps, etc. to feeder terminal electrodes 42a and 42b on the feed circuit board 10, while the mounting terminal electrodes are electrically connected through metal bumps, etc. to mounting electrodes 43a and 43b on the feed circuit board 10.

The inductance elements L1 and L2 included in the feed circuit 11 are magnetically coupled to each other in opposite phases, resonate at a frequency processed by the radio IC chip 5, and are electromagnetically coupled to the respective end portions 26a and 26b of the annular electrode 25. The feed circuit 11 matches the impedance (typically 50Ω) of the radio IC chip 5 to the impedance (spatial impedance, 377Ω) of the radiation plate 15.

The feed circuit 11 transmits, through the annular electrode 25 to the radiation plate 15, a transmission signal originating from the radio IC chip 5 and having a predetermined frequency. Also, the feed circuit 11 selects, from signals received by the radiation plate 15 and transmitted through the annular electrode 25, a reception signal having a predetermined frequency and supplies the selected reception signal to the radio IC chip 5. Thus, in the radio frequency IC device 2A, the radio IC chip 5 is operated by a signal received by the radiation plate 15, and a response signal from the radio IC chip 5 radiates outward from the radiation plate 15.

The annular electrode 25 has a predetermined electrical length from the end portion 26a to the end portion 26b, and has a predetermined resonant frequency corresponding to the electrical length. The radiation plate 15 also has a predetermined resonant frequency corresponding to its electrical length. The annular electrode 25 and the radiation plate 15 are designed such that f1 is lower than f2, where f1 is a resonant frequency of the annular electrode 25 and f2 is a resonant frequency of the radiation plate 15. That is, the annular electrode 25 and the radiation plate 15 are designed such that the electrical length of the annular electrode 25 alone is greater than or equal to that of the radiation plate 15 alone. The annular electrode 25 is electrically connected to the radiation plate 15 through the connecting portion 27. Preferably, a point at which a current passing through the annular electrode and a current passing through the radiation plate 15 reach their maximum values coincides with a point of connection between the annular electrode 25 and the radiation plate 15. Thus, a signal from the electromagnetic coupling module 1 propagates through the annular electrode 25 and is directly transmitted to the radiation plate 15. When a point at which both of the above-described currents reach their maximum values coincides with a point of connection between the annular electrode 25 and the radiation plate 15, it is possible to enhance coupling therebetween, and thus to improve signal transmission efficiency.

A signal from the annular electrode 25 is partially radiated as a magnetic field to the outside of the radio frequency IC device 2A, while a signal from the radiation plate 15 is radiated outward as an electric field. When the annular electrode 25 and the radiation plate 15 are designed such that the resonant frequency f1 of the annular electrode 25 is lower than the resonant frequency f2 of the radiation plate 15, it is possible to widen the frequency range of radiation characteristics of the radio frequency IC device.

Figure 4:
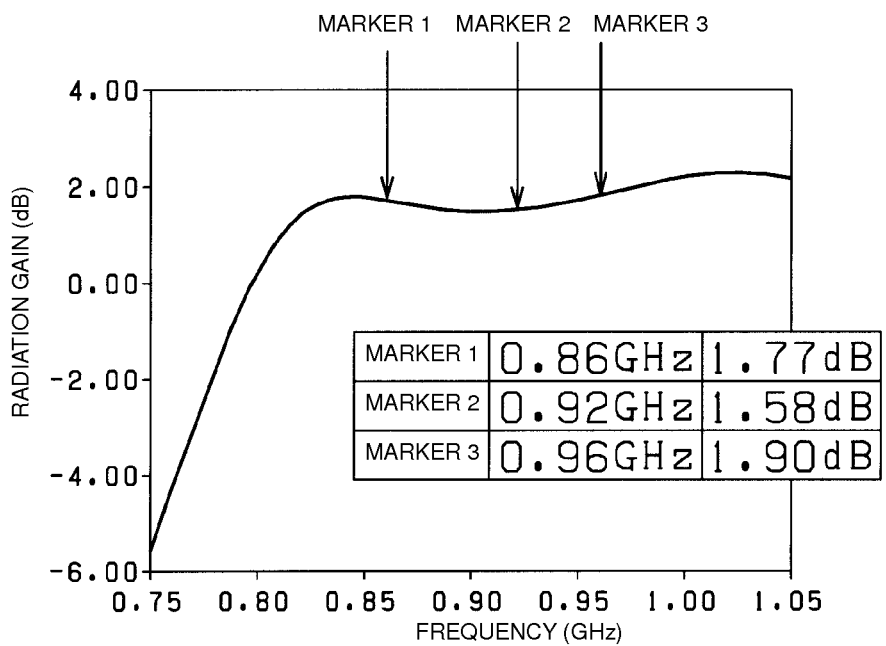
FIG. 4 is a graph showing frequency characteristics of a radiation gain of the radio frequency IC device according to the first preferred embodiment of the present invention.

FIG. 4 is a graph showing frequency characteristics of a radiation gain of the radio frequency IC device 2A according to the first preferred embodiment. As is apparent from FIG. 4, a radiation gain as high as about 1.5 dB or above can be achieved over a frequency band as wide as 100 MHz between the resonant frequency of the annular electrode 25 and the resonant frequency of the radiation plate 15 in a state where the annular electrode and the radiation plate 15 are coupled to each other. Referring to FIG. 4, marker 1 and marker 2 indicate a maximum usable frequency and a lowest usable frequency, respectively, of RFID in a UHF band.

When f0 is set to be between a frequency f1' of marker 1 and a frequency f2' of marker 2, where f0 is a frequency of a signal transmitted and received by the radio frequency IC device 2A, a good radiation gain can be achieved at a predetermined signal frequency f0. Even when the frequencies f1' and f2' may slightly change due to variations in manufacturing the annular electrode 25 and radiation plate 15, the radio frequency IC device 2A can operate without any problem at frequencies between the two frequencies f1' and f2'. Thus, a radio frequency IC device with improved reliability can be provided.

The annular electrode 25 and the radiation plate 15 are connected to each other through the connecting portion 27. When the annular electrode 25 and the radiation plate 15 are coupled to each other, the resonant frequency f2 of the radiation plate 15 is lower than the corresponding design value of the radiation plate 15 alone. Therefore, it is preferable to design the resonant frequency f1 of the annular electrode 25 alone to be lower than the resonant frequency f2 of the radiation plate 15. Thus, the radio frequency IC device 2A can achieve good radiation characteristics in a frequency band between the frequencies f1' and f2'. It is also preferable that the resonant frequency f1 of the annular electrode 25 alone be designed to be higher than the resonant frequency of the resonant circuit included in the feed circuit 11. As described above, when the annular electrode 25 is coupled to the radiation plate 15, the resonant frequency f1 of the annular electrode 25 is reduced. Therefore, when the resonant frequency f1 of the annular electrode 25 alone is designed to be higher than the resonant frequency f0 of the resonant circuit, the resonant frequency f0 can be set to be in a frequency band between the frequencies f1' and f2' during operation of the radio frequency IC device 2A, that is, in a state where the annular electrode 25 and the radiation plate 15 are coupled to each other. Thus, it is possible to perform stable communication while maintaining a high radiation gain. It is preferable that the resonant frequency f2 of the radiation plate 15 be less than half a signal wavelength λ.

As described above, in the radio frequency IC device 2A, a resonant frequency of a signal is set in the feed circuit 11 provided in the feed circuit board 10. Therefore, the radio frequency IC device 2A operates normally even when attached to various articles. At the same time, variations in radiation characteristics can be reduced, and there is no need to change the design of the radiation plate 15, etc., for each article. The frequency of a transmission signal radiated from the radiation plate 15 and the frequency of a reception signal supplied to the radio IC chip 5 are substantially equivalent to the resonant frequency of the feed circuit 11 in the feed circuit board 10. The frequencies of transmission and reception signals are determined in the feed circuit board 10. Therefore, regardless of the shapes, sizes, and arrangements of the radiation plate 15 and the annular electrode 25, that is, even when the radio frequency IC device 2A is, for example, rolled or sandwiched between dielectrics, there is no change in frequency characteristics and stable frequency characteristics can be achieved.

Next, a description will be given about the degree of coupling at the connecting portion 27 between the annular electrode 25 and the radiation plate 15. A width W and a spacing L (see FIG. 1B) at the connecting portion 27 affect the degree of this coupling. Specifically, as the width W and the spacing L increase, the degree of this coupling decreases.

As illustrated in FIG. 1C, the connecting portion 27 may be divided at two locations. In this case, the degree of coupling described above increases as a width W' increases, while decreases as a spacing L' increases.

Figure 5:
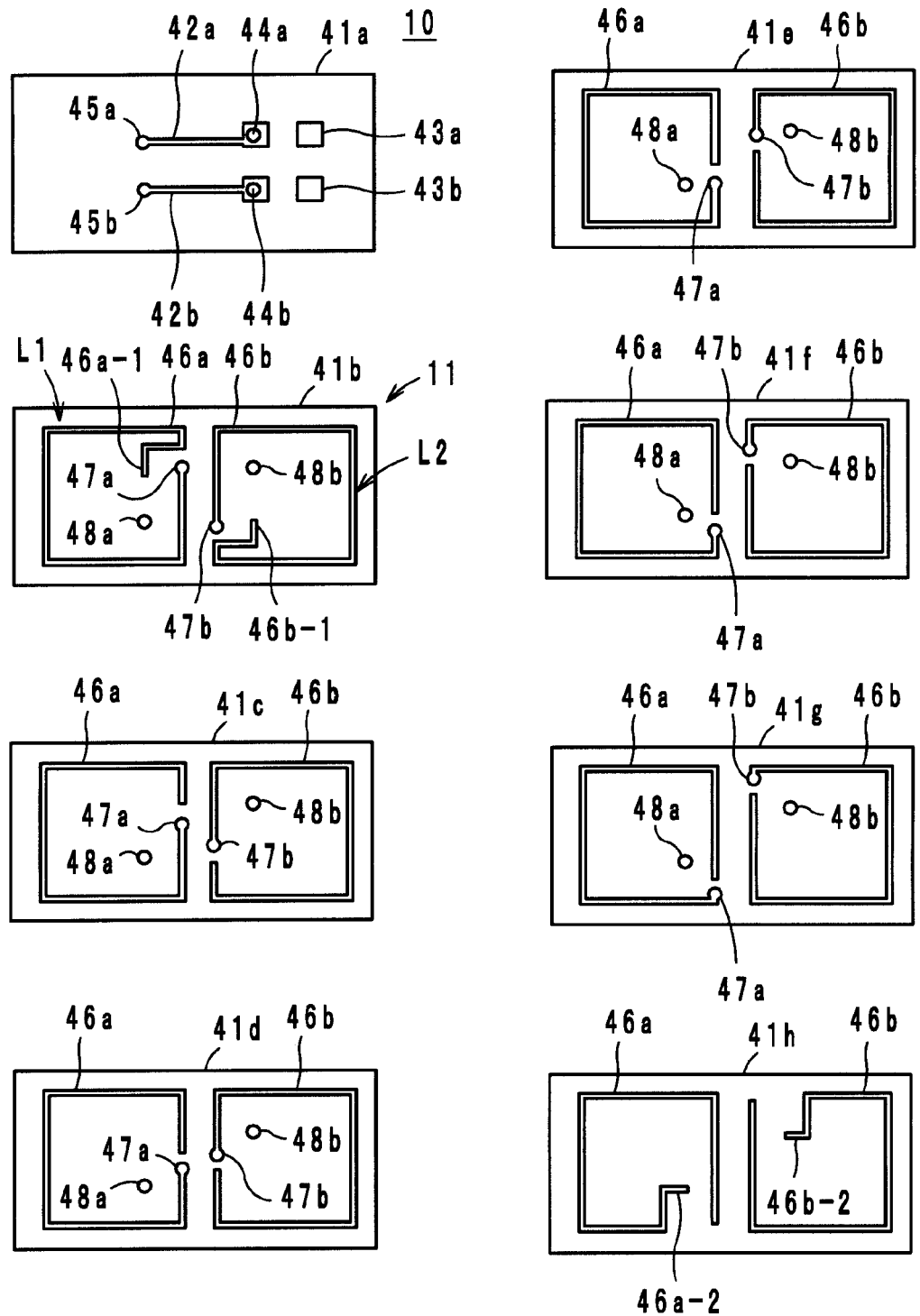
FIG. 5 is a plan view illustrating a laminated structure of the feed circuit board included in the radio frequency IC device according to the first preferred embodiment of the present invention.

Next, a configuration of the feed circuit board 10 will be described with reference to FIG. 5. The feed circuit board 10 is preferably formed by stacking, pressing, and firing dielectric or magnetic ceramic sheets 41a to 41h. The feeder terminal electrodes 42a and 42b, the mounting electrodes 43a and 43b, and via-hole conductors 44a, 44b, 45a, and 45b are formed on the uppermost sheet 41a. Line electrodes 46a and 46b constituting the inductance elements L1 and L2 are formed on each of the sheets 41b to 41h on the second to eighth layers, respectively. Via-hole conductors 47a, 47b, 48a, and 48b are also formed on the sheets 41b to 41h as necessary.

By stacking the sheets 41a to 41h, the line electrodes 46a are spirally connected through the via-hole conductors 47a to form the inductance element L1, while the line electrodes 46b are spirally connected through the via-hole conductors 47b to form the inductance element L2. A capacitance is formed between lines of the line electrodes 46a and 46b.

An end portion 46a-1 of the line electrode 46a on the sheet 41b is connected through the via-hole conductor 45a to the feeder terminal electrode 42a, while an end portion 46a-2 of the line electrode 46a on the sheet 41h is connected through the via-hole conductors 48a and 45b to the feeder terminal electrode 42b. An end portion 46b-1 of the line electrode 46b on the sheet 41b is connected through the via-hole conductor 44b to the feeder terminal electrode 42b, while an end portion 46b-2 of the line electrode 46b on the sheet 41h is connected through the via-hole conductors 48b and 44a to the feeder terminal electrode 42a.

In the feed circuit 11 described above, since the inductance elements L1 and L2 are wound in opposite directions, magnetic fields generated in the inductance elements L1 and L2 are cancelled out. Since the magnetic fields are cancelled out, it is necessary to increase the lengths of the line electrodes 46a and 46b to some extent to obtain desired inductance values. Thus, the Q factor is lowered, the steepness of a curve representing resonance characteristics is reduced, and the frequency band is widened in a region around the resonant frequency.

In a perspective plan view of the feed circuit board 10, the inductance elements L1 and L2 are located at different positions on the left and right. The magnetic fields generated in the inductance elements L1 and L2 are opposite in direction. Thus, when the feed circuit 11 is coupled to the end portions 26a and 26b of the annular electrode 25, currents of opposite directions are excited in the end portions 26a and 26b, so that the annular electrode 25 can transmit and receive a signal to and from the radiation plate 15.

The annular electrode 25 is preferably rectangular in the first preferred embodiment, but may be elliptical or another shape. This applies to the other preferred embodiments described below.

Figure 6:
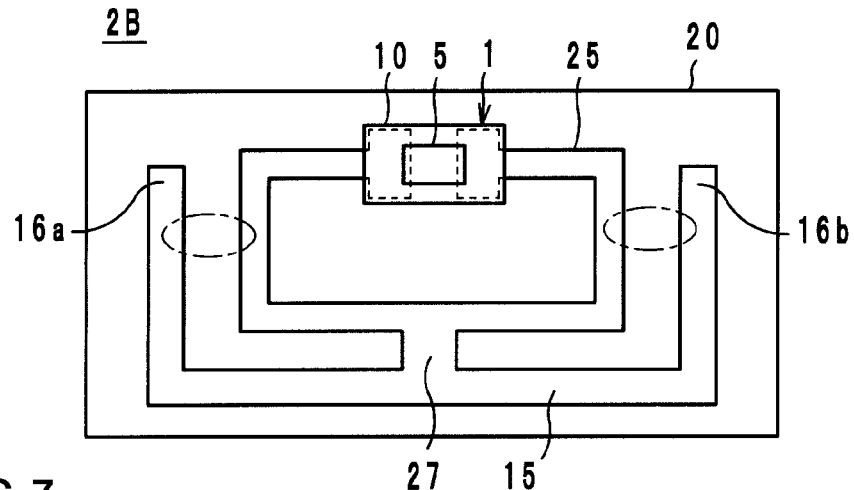
FIG. 6 is a plan view illustrating a radio frequency IC device according to a second preferred embodiment of the present invention.

Second Preferred Embodiment (FIG. 6)

FIG. 6 illustrates a radio frequency IC device 2B according to a second preferred embodiment of the present invention. The radio frequency IC device 2B is substantially the same as the radio frequency IC device 2A of the first preferred embodiment in that it includes the electromagnetic coupling module 1 having the radio IC chip 5 and the feed circuit board 10, the annular electrode 25, and the radiation plate 15. A difference from the radio frequency IC device 2A is that the radiation plate 15 of the radio frequency IC device 2B includes end portions 16a and 16b bent and extending along their corresponding sides of the annular electrode 25.

Since the radiation plate 15 includes the end portions 16a and 16b bent toward the annular electrode 25, the radio frequency IC device 2B of the second preferred embodiment is compact in size. Moreover, by directing the end portions 16a and 16b of the radiation plate 15 in a predetermined direction, directivity in the predetermined direction can be improved. Additionally, since bent portions including the end portions 16a and 16b are arranged in close proximity to the annular electrode 25, electromagnetic coupling that occurs as a secondary effect can further enhance the coupling between the annular electrode 25 and the radiation plate 15. It is thus possible to improve a radiation gain of the radio frequency IC device and further widen the frequency range of radiation characteristics of the radio frequency IC device.

Figure 7:
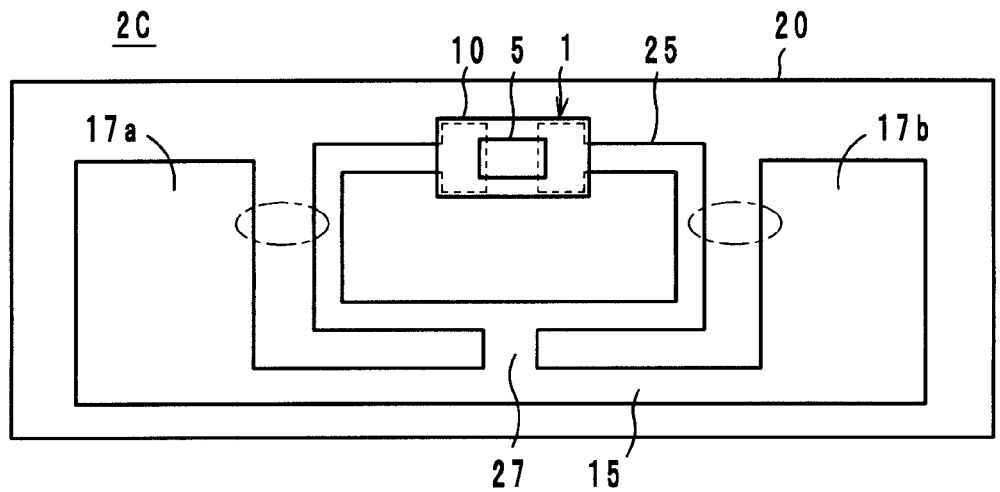
FIG. 7 is a plan view illustrating a radio frequency IC device according to a third preferred embodiment of the present invention.

Third Preferred Embodiment (FIG. 7)

FIG. 7 illustrates a radio frequency IC device 2C according to a third preferred embodiment of the present invention. In the radio frequency IC device 2C, the radiation plate 15 includes wide portions 17a and 17b at its ends. The other configurations are the same as those of the first and second preferred embodiments, and operational effects of the third preferred embodiment are also the same as those of the first and second preferred embodiments.

Figure 8:
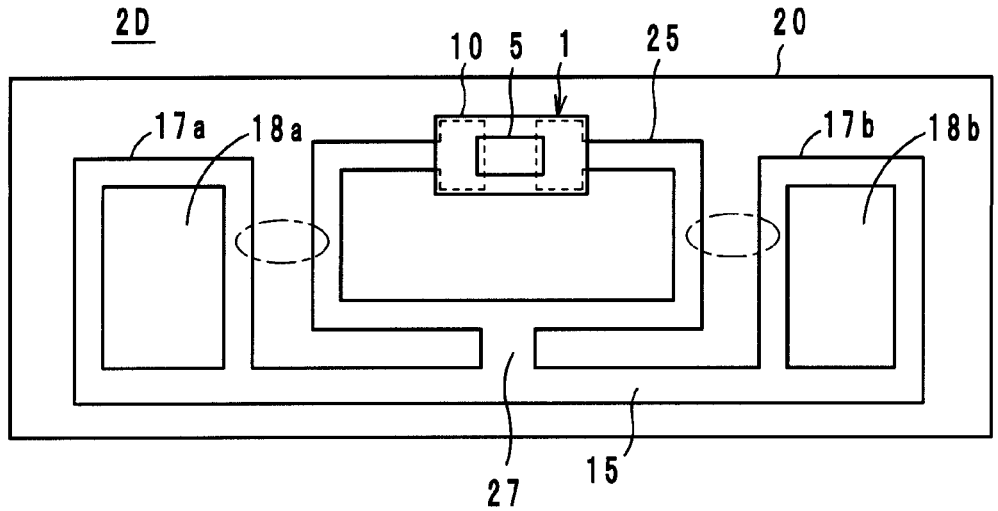
FIG. 8 is a plan view illustrating a radio frequency IC device according to a fourth preferred embodiment of the present invention.

Fourth Preferred Embodiment (FIG. 8)

FIG. 8 illustrates a radio frequency IC device 2D according to a fourth preferred embodiment of the present invention. In the radio frequency IC device 2D, the wide portions 17a and 17b of the radiation plate 15 include empty spaces 18a and 18b, respectively. The other configurations are the same as those of the first and third preferred embodiments, and operational effects of the fourth preferred embodiment are also the same as those of the first and third preferred embodiments. In the fourth preferred embodiment, in particular, providing the empty spaces 18a and 18b in the wide portions 17a and 17b makes it possible to lower the resonant frequency of the radiation plate 15 and reduce the overall length of the radiation plate 15. It is thus possible to reduce the size of the radio frequency IC device while improving its radiation characteristics.

Figure 9:
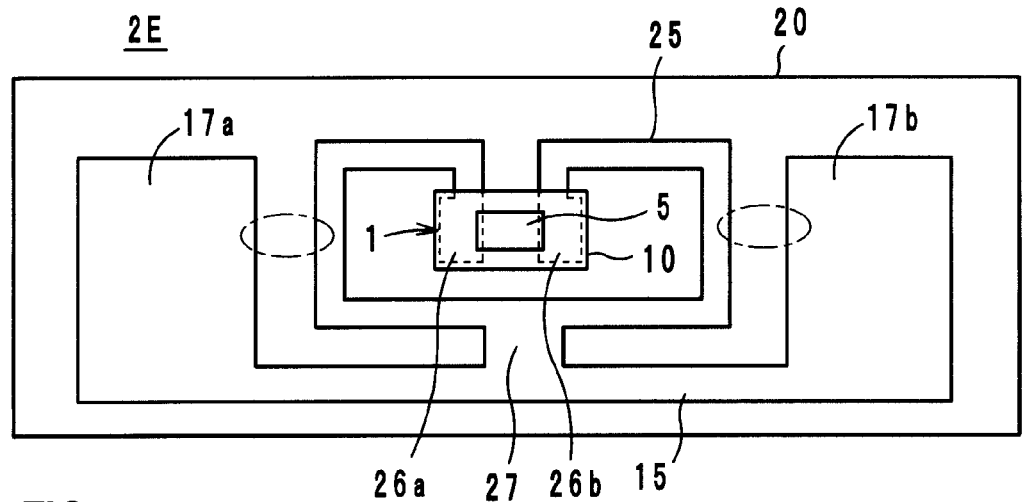
FIG. 9 is a plan view illustrating a radio frequency IC device according to a fifth preferred embodiment of the present invention.

Fifth Preferred Embodiment (FIG. 9)

FIG. 9 illustrates a radio frequency IC device 2E according to a fifth preferred embodiment of the present invention. In the radio frequency IC device 2E, the end portions 26a and 26b of the annular electrode 25 are bent toward the inside of the annular electrode 25. The other configurations are the same as those of the first and third preferred embodiments, and operational effects of the fifth preferred embodiment are also the same as those of the first and third preferred embodiments. In the fifth preferred embodiment, in particular, since the end portions 26a and 26b are arranged toward the inside of the annular electrode 25, bent portions including the end portions 26a and 26b and their adjacent line portions of the annular electrode 25 form a capacitance. The resonant frequency of the annular electrode 25 can be designed on the basis of this capacitance and the length of the annular electrode 25. It is possible to reduce the overall length of the annular electrode 25, and thus to reduce the size of the radio frequency IC device. Also, the degree of freedom in designing the annular electrode 25 can be increased.

Figure 10:
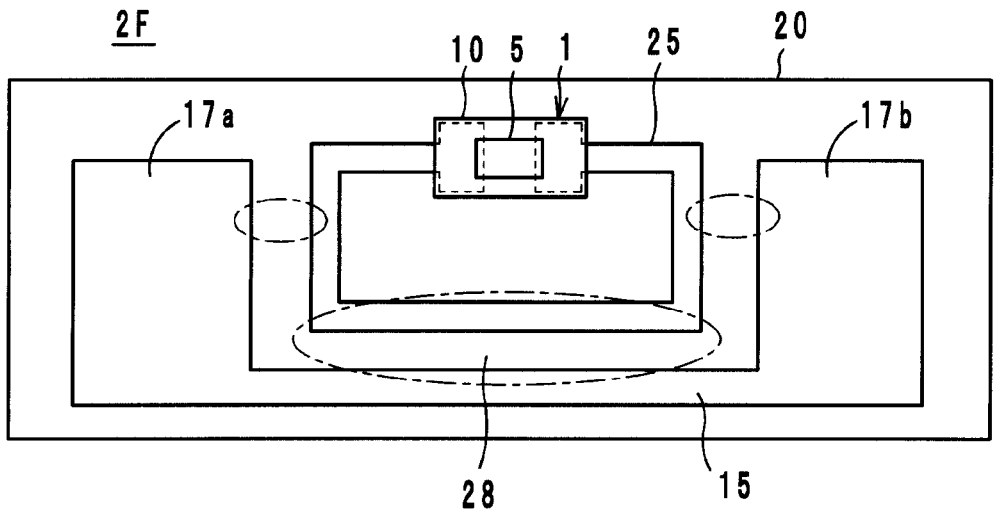
FIG. 10 is a plan view illustrating a radio frequency IC device according to a sixth preferred embodiment of the present invention.

Sixth Preferred Embodiment (FIG. 10)

FIG. 10 illustrates a radio frequency IC device 2F according to a sixth preferred embodiment of the present invention. In the radio frequency IC device 2F, the annular electrode 25 and the radiation plate 15 are electrically isolated from each other and not connected through the connecting portion 27. That is, a portion of the annular electrode 25 is adjacent to and in parallel with the radiation plate 15. The adjacent portions of the annular electrode 25 and the radiation plate 15 are electromagnetically coupled to each other to define a coupling portion 28, through which a signal is transmitted and received.

A signal from the electromagnetic coupling module 1 propagates through the annular electrode 25 and causes a magnetic field to be generated around the annular electrode 25. The magnetic field generated around the annular electrode 25 is coupled to the radiation plate 15 in the coupling portion 28, so that a signal is transmitted and received therebetween. The degree of coupling between the annular electrode 25 and the radiation plate 15 can be changed by varying the distance between the annular electrode 25 and the radiation plate 15 in the coupling portion 28 and the length of the coupling portion 28. Additionally, since the radiation plate 15 and the annular electrode 25 are electrically isolated from each other, static electricity entering from the radiation plate 15 can be blocked by the coupling portion 28. It is thus possible to prevent the radio IC chip 5 from being broken by static electricity.

The other configurations of the sixth preferred embodiment are the same as those of the first and third preferred embodiments, and operational effects of the sixth preferred embodiment are basically the same as those of the first and third preferred embodiments described above.

Figure 11:
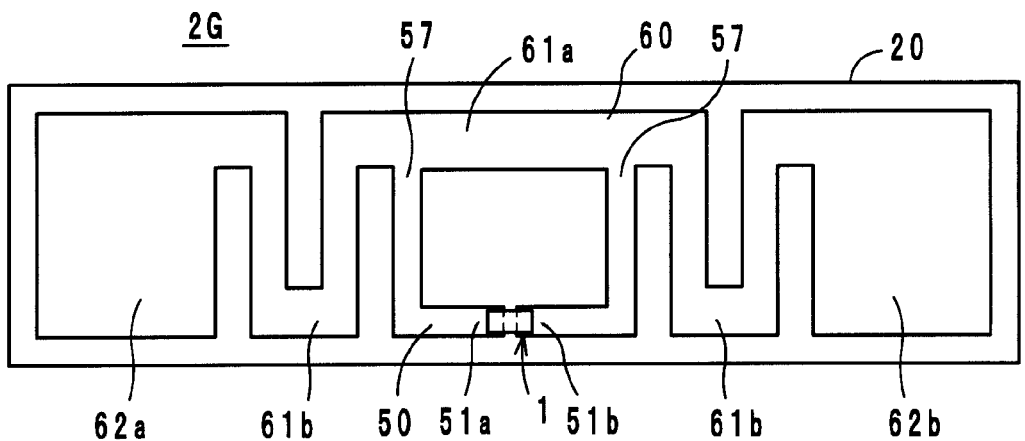
FIG. 11 is a plan view illustrating a radio frequency IC device according to a seventh preferred embodiment of the present invention.
Figure 12:
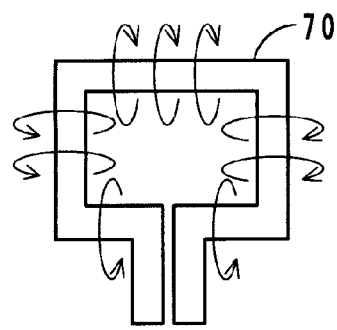
FIG. 12 is a plan view illustrating a first example of a radiation plate of a reader/writer.
Figure 13:
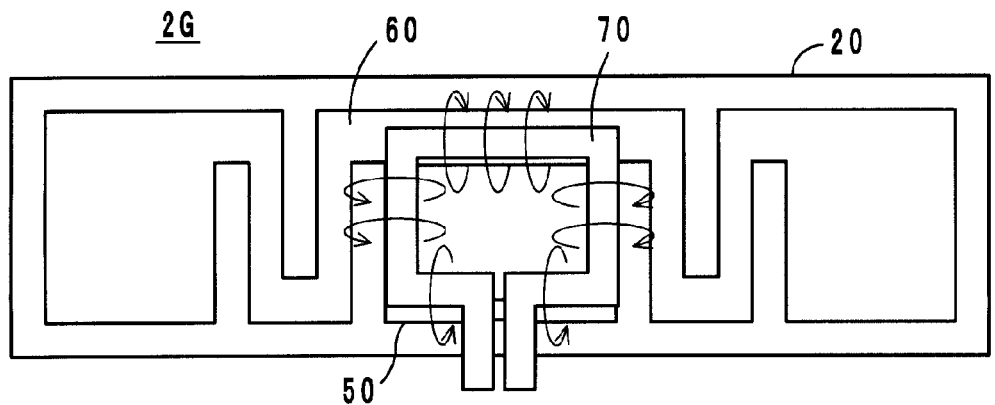
FIG. 13 is a plan view illustrating a state in which the radiation plate of the reader/writer is placed over the radio frequency IC device according to the seventh preferred embodiment of the present invention.

Seventh Preferred Embodiment (FIG. 11 to FIG. 13)

FIG. 11 illustrates a radio frequency IC device 2G according to a seventh preferred embodiment of the present invention. The radio frequency IC device 2G includes the electromagnetic coupling module 1 described in the first preferred embodiment, and a magnetic-field radiation plate 50 and an electric-field radiation plate 60 that are formed on the base 20.

The magnetic-field radiation plate 50 is constituted by an annular electrode including a pair of end portions 51a and 51b. The end portions 51a and 51b are electromagnetically coupled to the feed circuit 11 (see FIG. 2) in the feed circuit board 10. The electric-field radiation plate 60 preferably has a dipole shape, and includes a base portion 61a, bent portions 61b, and wide end portions 62a and 62b. The electric-field radiation plate 60 is electrically connected through connecting portions 57 to the magnetic-field radiation plate 50. In other words, the magnetic-field radiation plate 50 is provided in a portion of the electric-field radiation plate 60. Alternatively, the radiation plates 50 and 60 may be electrically isolated from each other, but arranged in close proximity and electromagnetically coupled to each other (see the sixth preferred embodiment illustrated in FIG. 10).

Like the radiation plate 15 described above, the electric-field radiation plate 60 is used in long-distance communication with a reader/writer. The magnetic-field radiation plate 50 allows short-distance communication with a reader/writer. For short-distance communication, a reader/writer includes a magnetic-field radiation plate 70 (see FIG. 12) constituted by an annular electrode. In planar view, the magnetic-field radiation plate 70 is substantially the same in size as the magnetic-field radiation plate 50 of the radio frequency IC device 2G. From the magnetic-field radiation plate 70, magnetic fields indicated by arrows in FIG. 12 are generated in near fields. From the magnetic-field radiation plate 50, similar magnetic fields are generated in near fields. As illustrated in FIG. 13, by placing the radiation plate 70 over the radiation plate 50, the radiation plates 50 and 70 are magnetically coupled in close proximity to each other and thus, short-distance communication therebetween is performed.

Impedance matching between the radio IC chip 5 and the radiation plates 50 and 60 is performed in the resonant circuit of the feed circuit 11. The magnetic-field radiation plate 50 can be relatively freely designed regardless of impedance matching, and it is possible to secure a large area where a magnetic flux crosses. As a result, it becomes possible to perform short-distance communication with a reader/writer using a small amount of energy. With the magnetic-field radiation plate 50 and the electric-field radiation plate 60, the radio frequency IC device 2G is capable of performing both long-distance and short-distance communication with the reader/writer, and thus can be used in a wider range of applications. Moreover, since the magnetic-field radiation plate 50 and the electric-field radiation plate 60 radiate a magnetic field and an electric field, respectively, and there is little interference therebetween, it is possible to independently design the magnetic-field radiation plate 50 and the electric-field radiation plate 60.

In particular, in the stage of manufacturing the radio frequency IC device 2G, when a plurality of the radio frequency IC devices 2G arranged in close proximity are assigned IDs and subjected to characteristic testing, the magnetic-field radiation plate 50 and the magnetic-field radiation plate 70 of a reader/writer make it possible to perform short-distance communication between the reader/writer and only a specific radio frequency IC device 2G distinguished from the other radio frequency IC devices 2G.

Figure 14:
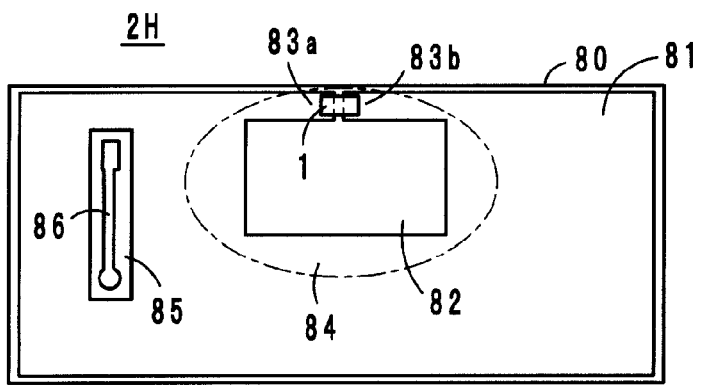
FIG. 14 is a plan view illustrating a radio frequency IC device according to an eighth preferred embodiment of the present invention.

Eighth Preferred Embodiment (FIG. 14)

FIG. 14 illustrates a radio frequency IC device 2H according to an eighth preferred embodiment of the present invention. In the radio frequency IC device 2H, a ground electrode 81 on a printed circuit board 80 defines an electric-field radiation plate. The ground electrode 81 has an empty space 82, and the electromagnetic coupling module 1 is coupled to end portions 83a and 83b of the ground electrode 81. Thus, an area (i.e., a region 84 indicated by an alternate long and short dashed line) around the empty space 82 functions as a magnetic-field radiation plate. An electrode 86 provided in another empty space 85 of the ground electrode 81 is a wiring pattern, which is connected via a through hole to an internal element (not shown).

Operational effects of the eighth preferred embodiment are the same as those of the seventh preferred embodiment. In particular, in the eighth preferred embodiment where the ground electrode 81 serves as a radiation plate, it is not necessary to form an additional radiation plate. When a unique ID is written to the radio frequency IC device 2H in the process of manufacturing an apparatus (e.g., mobile phone) including the printed circuit board 80, the ID can be used in process management and history management.

Figure 15:
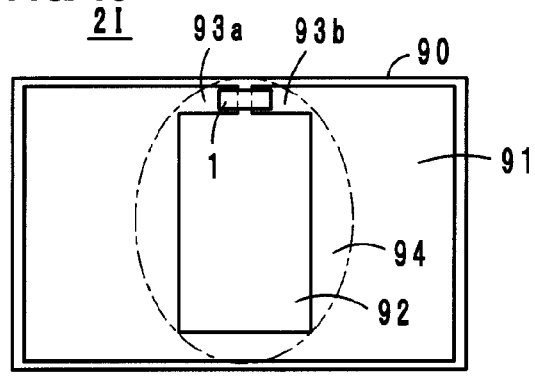
FIG. 15 is a plan view illustrating a radio frequency IC device according to a ninth preferred embodiment of the present invention.

Ninth Preferred Embodiment (FIG. 15)

FIG. 15 illustrates a radio frequency IC device 2I according to a ninth preferred embodiment of the present invention. In the radio frequency IC device 2I, an electrode 91 disposed over a substantially entire surface of a base 90 defines an electric-field radiation plate. The electrode 91 includes an empty space 92, and the electromagnetic coupling module 1 is coupled to end portions 93a and 93b of the electrode 91. Thus, an area (i.e., a region 94 indicated by an alternate long and short dashed line) around the empty space 92 functions as a magnetic-field radiation plate.

Figure 16:
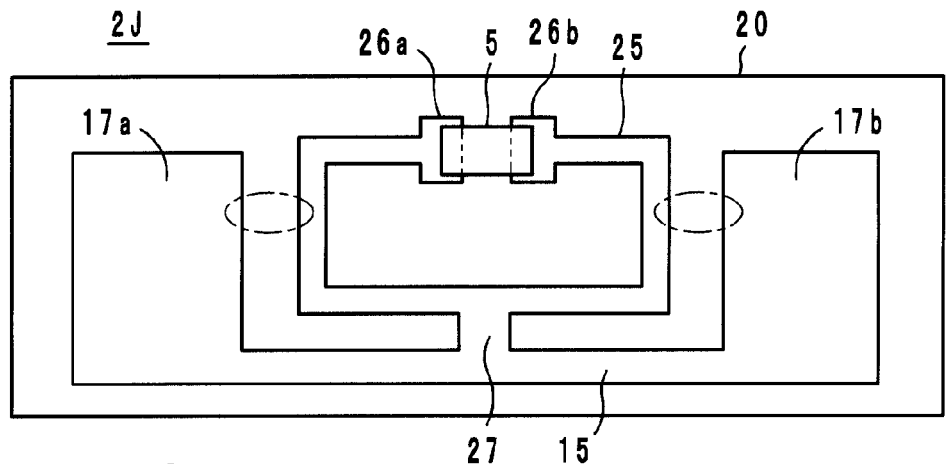
FIG. 16 is a plan view illustrating a radio frequency IC device according to a tenth preferred embodiment of the present invention.
Figure 17:
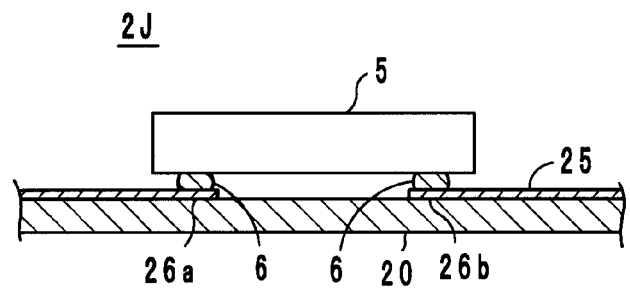
FIG. 17 is a cross-sectional view illustrating a main portion of the radio frequency IC device according to the tenth preferred embodiment of the present invention.

Tenth Preferred Embodiment (FIG. 16 and FIG. 17)

FIG. 16 and FIG. 17 illustrate a radio frequency IC device 2J according to a tenth preferred embodiment of the present invention. In the radio frequency IC device 2J, the radio IC chip 5 is mounted on the pair of end portions 26a and 26b of the annular electrode 25, with conductive adhesives 6 interposed therebetween. The annular electrode 25 is coupled to the dipole radiation plate 15. In other words, the radio frequency IC device 2J of the tenth preferred embodiment is realized by removing the feed circuit board 10 from the radio frequency IC device 2C of the third preferred embodiment. In the radio frequency IC device 2J, the annular electrode 25 functions as an impedance matching circuit (resonant circuit). Although no feed circuit is provided, the radio frequency IC device 2J is capable of transmitting and receiving a radio signal without any problem.

In the present preferred embodiment, the pair of end portions 26a and 26b of the annular electrode 25 is disposed at a position farthest from the connecting portion 27, through which the annular electrode 25 is connected to the radiation plate 15. Alternatively, the end portions 26a and 26b may be disposed in close proximity to the radiation plate 15.

Figure 18:
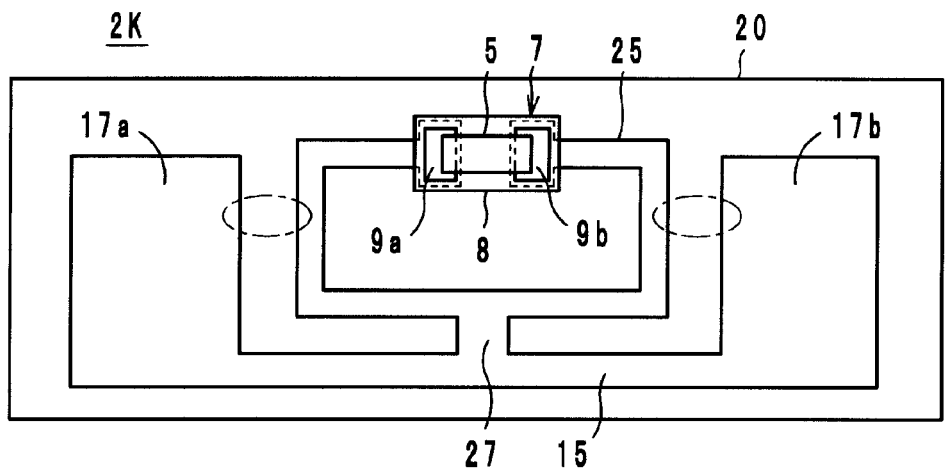
FIG. 18 is a plan view illustrating a radio frequency IC device according to an eleventh preferred embodiment of the present invention.
Figure 19:
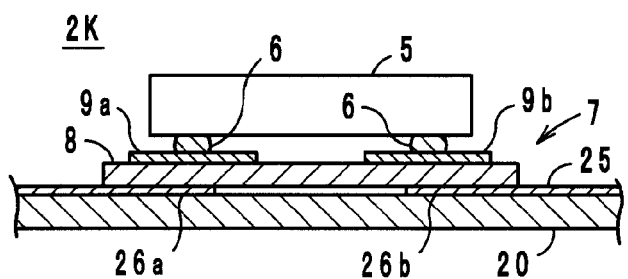
FIG. 19 is a cross-sectional view illustrating a main portion of the radio frequency IC device according to the eleventh preferred embodiment of the present invention.

Eleventh Preferred Embodiment (FIG. 18 and FIG. 19)

FIG. 18 and FIG. 19 illustrate a radio frequency IC device 2K according to an eleventh preferred embodiment of the present invention. In the radio frequency IC device 2K, the radio IC chip 5 is mounted on the pair of end portions 26a and 26b of the annular electrode 25, with an interposer 7 disposed therebetween. The annular electrode 25 is coupled to the dipole radiation plate 15. The interposer 7 is preferably made by forming line electrodes 9a and 9b on a surface of a base 8, such as a PET film, for example. The interposer 7 is bonded to the end portions 26a and 26b of the annular electrode 25 such that the line electrodes 9a and 9b are disposed opposite to the end portions 26a and 26b, respectively, and coupled thereto. The line electrodes 9a and 9b are capacitively coupled to the end portions 26a and 26b. The radio IC chip 5 is mounted on the line electrodes 9a and 9b, with the conductive adhesives 6 interposed therebetween.

The interposer 7 serves to connect the radio IC chip 5 to the annular electrode 25, but does not serve as a feed circuit. In this respect, the eleventh preferred embodiment is the same as the tenth preferred embodiment in which the feed circuit board 10 is not provided. In the tenth preferred embodiment, it is difficult to directly and automatically mount the radio IC chip 5, which is a very small component, on the base 20. However, automatically mounting the radio IC chip 5 on the interposer 7 is relatively easy, because the radio IC chip 5 and the interposer 7 are not significantly different in size. The degree of accuracy needed to bond the interposer 7 having the radio IC chip 5 mounted thereon to the base 20, the interposer 7 being relatively large in size, is not very high. Therefore, the radio frequency IC device 2K of the eleventh preferred embodiment can be more easily manufactured than the radio frequency IC device 2J of the tenth preferred embodiment.

In the present preferred embodiment, the interposer 7 is preferably disposed such that it is coupled to the end portions 26a and 26b of the annular electrode 25. Alternatively, the interposer 7 may be disposed in areas where the annular electrode 25 and the wide end portions 17a and 17b at the ends of the radiation plate 15 are located in close proximity. By coupling the interposer 7 simultaneously to both the annular electrode 25 and the radiation plate 15, it is possible to provide a radio frequency IC device with improved radiation characteristics. The line electrodes 9a and 9b of the interposer 7 may be coupled to the end portions 26a and 26b of the annular electrode 25 not only capacitively, but also magnetically and moreover, the line electrodes 9a and 9b may be made electrically connected to the end portions 26a and 26b through conductive adhesives.

Proximity Arrangement of Electric-field Radiation Plate and Magnetic-field Radiation Plate In the seventh, eighth, and ninth preferred embodiments, each radio frequency IC device has been described as one preferably including an electric-field radiation plate and a magnetic-field radiation plate. In the first to sixth, tenth, and eleventh preferred embodiments described above, the dipole radiation plate 15 preferably functions as an electric-field radiation plate and the annular electrode 25 preferably functions as a magnetic-field radiation plate. In the latter case, the radiation plate 15 and the annular electrode 25 may be arranged such that an electric field generated by the electric-field radiation plate and a magnetic field generated by the magnetic-field radiation plate are perpendicular or substantially perpendicular to each other.

Conventionally, it has not been possible to arrange an electric-field radiation plate and a magnetic-field radiation plate in close proximity to each other. This is because central axes of the two radiation plates may deviate, or an electric field and a magnetic field cannot be made perpendicular or substantially perpendicular to each other and may interfere with each other. However, in the preferred embodiments described above, an annular electrode defines a magnetic-field radiation plate, so that a magnetic field generated around the annular electrode is used for communication. In magnetic field radiation, an electric field is generated radially in the directions of upper and lower surfaces and upper and lower sides of the electrode plane. In the preferred embodiments described above, since an electric field is radiated in a direction tangent to a magnetic field generated in the annular electrode, the magnetic field and the electric field are made perpendicular or substantially perpendicular to each other and are not coupled to each other. Thus, the electric-field radiation plate and the magnetic-field radiation plate can be arranged in close proximity to each other, and a radio frequency IC device having good radiation characteristics can be provided.

In areas where the magnetic-field radiation plate and the electric-field radiation plate are adjacent to each other, a magnetic field generated around the magnetic-field radiation plate is coupled to an edge of the electric-field radiation plate and thus, the electric-field radiation plate and the magnetic-field radiation plate are magnetically coupled to each other. The electric-field radiation plate is magnetically coupled but functions as an electric-field radiation plate, because signals radiated therefrom are mostly electric fields.

Figure 20:
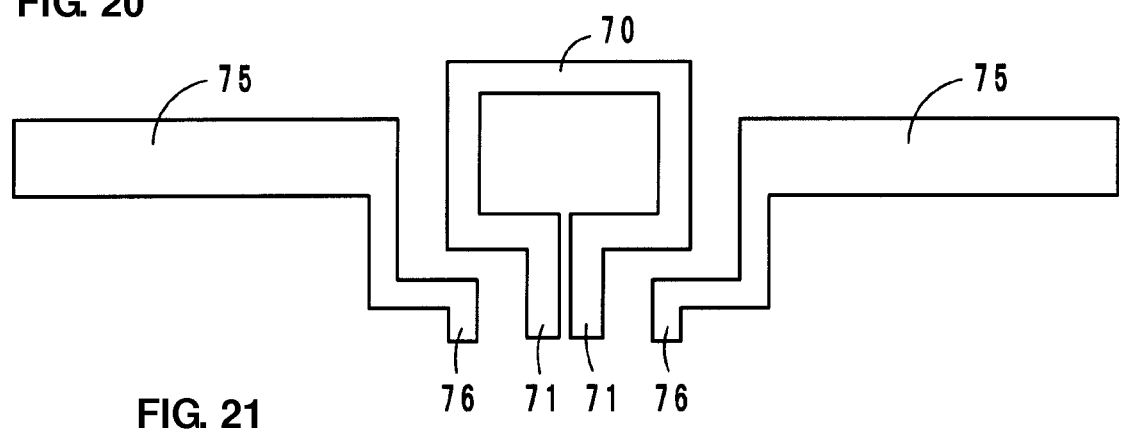
FIG. 20 is a plan view illustrating a second example of a radiation plate of a reader/writer.

Radiation Plate of Reader/Writer (FIG. 20)

FIG. 20 illustrates a radiation plate of a reader/writer that is combined with the radio frequency IC devices 2G, 2H, and 2I of the seventh, eighth, and ninth preferred embodiments (or may also be combined with the radio frequency IC devices of the first to sixth, tenth, and eleventh preferred embodiments) to provide a radio communication system. The radiation plate includes the magnetic-field radiation plate illustrated in FIG. 12 and dipole electric-field radiation plates 75. End portions 76 of the electric-field radiation plates 75 are connected to port 1 of the reader/writer, while end portions 71 of the magnetic-field radiation plate 70 are connected to port 2 of the reader/writer.

By transmitting and receiving a signal while switching between ports 1 and 2, the reader/writer is capable of determining whether a radio frequency IC device operates at a magnetic-field radiation plate or an electric-field radiation plate. Therefore, in this radio communication system, it is possible to detect whether the radio frequency IC device is close to or far from the reader/writer, and exchange appropriate information in accordance with the detection.

Figure 21:
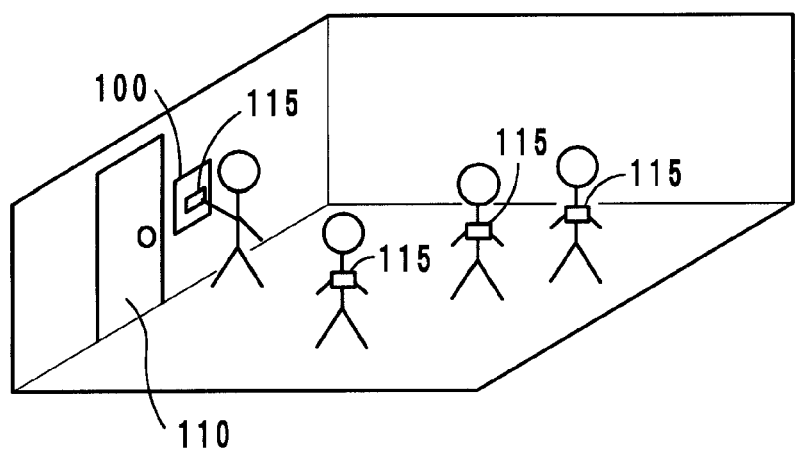
FIG. 21 illustrates a preferred embodiment of a radio communication system according to the present invention.

Preferred Embodiment of Radio Communication System (FIG. 21)

FIG. 21 illustrates a preferred embodiment of a radio communication system according to the present invention. In the radio communication system of FIG. 21, a reader/writer 100 including a magnetic-field radiation plate and an electric-field radiation plate (e.g., the radiation plates 70 and 75 illustrated in FIG. 16) is installed near a door 110, and one of the radio frequency IC devices described above is disposed on a security card 115 carried by each person in the room, for example.

Through communication between the electric-field radiation plate of the reader/writer 100 and that of the radio frequency IC device, information is exchanged between the reader/writer 100 and the radio frequency IC device embedded in the security card 115 of each person in the room. By bringing the security card 115 close to the reader/writer 100, communication between their magnetic-field radiation plates is made, so that the door 110 is controlled to be automatically opened. That is, the reader/writer 100 is capable not only of allowing the door 110 to be opened or closed in accordance with the intention of a person carrying the security card 115, but also of obtaining information about each person in the room.

Summary of Preferred Embodiments

In the radio frequency IC device, the feed circuit may be provided on the feed circuit board, and the radio IC and the feed circuit board may constitute an electromagnetic coupling module.

It is preferable that a resonant frequency of the annular electrode alone be higher than a resonant frequency of the resonant circuit and lower than a resonant frequency of the radiation plate alone. It is further preferable that a frequency of a signal transmitted and received by the radiation plate in a state where the annular electrode and the radiation plate are coupled to each other be higher than a resonant frequency of the annular electrode and lower than a resonant frequency of the radiation plate. When the resonant frequency of the annular electrode is set to be lower than that of the radiation plate, it is possible to widen the frequency range of signal radiation characteristics. When the annular electrode and the radiation plate are simply designed such that the frequency of a signal to be transmitted and received is between the resonance frequencies of the annular electrode and the radiation plate, the radio frequency IC device can be used in RFID systems from all over the world, the RFID systems being different in usable signal frequency.

The annular electrode and the radiation plate may be arranged such that a magnetic field generated around the annular electrode is perpendicular or substantially perpendicular to an electric field generated around the dipole radiation plate.

The annular electrode may be electrically connected to the radiation plate. This can enhance the coupling between the annular electrode and the radiation plate, improve signal transmission efficiency between the annular electrode and the radiation plate, and thus can make it possible to achieve excellent radiation characteristics. When a portion of the annular electrode is arranged in close proximity to the radiation plate, it is possible to achieve further excellent radiation characteristics.

The annular electrode and the radiation plate may be disposed on the same base. This makes it possible to manufacture the annular electrode and the radiation plate in the same process.

The radiation plate may have wide portions at both ends thereof, the wide portions being wider than a line width of a center portion in a longitudinal direction of the radiation plate. Each of the wide portions may have an empty space. By providing the wide portions at both ends of the radiation plate, it is possible to reduce the length of the radiation plate and the size of the radio frequency IC device.

The pair of end portions of the annular electrode may be arranged toward the inside of the annular electrode. Thus, since portions of the annular electrode are arranged in close proximity, capacitance occurs between adjacent portions of the annular electrode, and the resonant frequency of the annular electrode can be designed on the basis of the capacitance components and inductance components of the annular electrode. Therefore, it is possible to reduce the length of the annular electrode and the size of the radio frequency IC device.

A frequency of a signal transmitted and received by the radiation plate is substantially determined by a resonant frequency of the resonant circuit. Thus, it is possible to freely design the shapes and sizes of the annular electrode and radiation plate.

The feed circuit board may be a ceramic or resin multilayer board, for example. In particular, when inductance elements constituting the feed circuit are embedded in the circuit board, the feed circuit can be made less likely to be affected by factors outside the circuit board and thus, variations in radiation characteristics can be reduced.

The radiation plate functions as an electric-field radiation plate, while the annular electrode functions as a magnetic-field radiation plate. By providing a magnetic-field radiation plate constituted by an annular electrode in a reader/writer and bringing the magnetic-field radiation plate close to a magnetic-field radiation plate (annular electrode) of a radio frequency IC device, a control circuit included in a radio IC can be operated. In the radio frequency IC device, impedance matching is performed in a resonant circuit, and the magnetic-field radiation plate can be relatively freely designed regardless of the impedance matching. Therefore, it is possible to secure a large area where a magnetic flux crosses. As a result, it becomes possible to perform short-distance communication with the reader/writer using a small amount of energy. With the magnetic-field radiation plate and the electric-field radiation plate, the radio frequency IC device is capable of performing both long-distance and short-distance communication with the reader/writer, and thus can be used in a wider range of applications.

The annular electrode 25 of the first to sixth, tenth, and eleventh preferred embodiments also functions as the magnetic-field radiation plate 50 described in the seventh preferred embodiment. Therefore, the description of the magnetic-field radiation plate 50 is also applicable to the annular electrode 25.

Other Preferred Embodiments

The radio frequency IC device and the radio communication system according to the present invention are not limited to the various preferred embodiments described above, and may be variously modified within the scope of the invention.

For example, the materials of the radiation plate and base discussed in the above preferred embodiments are shown for illustrative purposes only. Any materials having necessary properties may be used. Also, the radio IC chip may be connected to the plane electrode by processing other than by forming metal bumps therebetween.

Additionally, the radio IC may be formed as an element within the feed circuit board. By forming a radio IC unit within the feed circuit board, it is possible to eliminate parasitic components at the connecting portion between the radio IC unit and the feed circuit, and thus to improve characteristics of the radio frequency IC device. It is also possible to reduce the profile of the radio frequency IC device.

Although the annular electrode and the radiation plate are symmetrical in each of the preferred embodiments described above, each annular electrode may be connected or coupled to its corresponding radiation plate at a different position.

As described above, various preferred embodiments of the present invention are useful when applied to a radio frequency IC device and a radio communication system. In particular, preferred embodiments of the present invention are excellent in that they make it possible to widen a frequency band where impedance matching between a radio IC and a radiation plate can be achieved, and to provide desired radiation characteristics over a wide range of frequencies.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A radio frequency IC device comprising:
a radio IC;
an annular electrode coupled to the radio IC and including at least a pair of end portions; and
a dipole radiation plate coupled to the annular electrode; wherein
a resonant frequency of the annular electrode is lower than a resonant frequency of the dipole radiation plate;
both of the annular electrode and the dipole radiation plate define antenna elements;
the annular electrode is a magnetic-field antenna element that communicates data of the radio IC using the lower resonant frequency; and
the dipole radiation plate is an electric-field antenna element that communicates data of the radio IC using the higher resonant frequency.

2. A radio frequency IC device comprising: a radio IC;
an interposer coupled to the radio IC and including a line electrode located on at least one principal surface of a base and/or inside the base;
an annular electrode including at least a pair of end portions; and a dipole radiation plate coupled to the annular electrode; wherein
the line electrode is coupled to at least one of the annular electrode and the radiation plate;
a resonant frequency of the annular electrode is lower than a resonant frequency of the dipole radiation plate;
both of the annular electrode and the dipole radiation plate define antenna elements;
the annular electrode is a magnetic-field antenna element that communicates data of the radio IC using the lower resonant frequency; and
the dipole radiation plate is an electric-field antenna element that communicates data of the radio IC using the higher resonant frequency.

3. A radio frequency IC device comprising: a radio IC;
a feed circuit coupled to the radio IC, and including a resonant circuit including an inductance element and having a predetermined resonant frequency;
an annular electrode including at least a pair of end portions and electromagnetically coupled to the feed circuit at the pair of end portions; and
a dipole radiation plate coupled to the annular electrode; wherein
a resonant frequency of the annular electrode is lower than a resonant frequency of the dipole radiation plate;
both of the annular electrode and the dipole radiation plate define antenna elements;
the annular electrode is a magnetic-field antenna element that communicates data of the radio IC using the lower resonant frequency; and
the dipole radiation plate is an electric-field antenna element that communicates data of the radio IC using the higher resonant frequency.

4. The radio frequency IC device according to claim 3, wherein the feed circuit is located on the feed circuit board and the radio IC and the feed circuit board constitute an electromagnetic coupling module.

5. The radio frequency IC device according to claim 1, wherein a resonant frequency of the annular electrode alone is higher than a resonant frequency of the resonant circuit and lower than a resonant frequency of the radiation plate alone.

6. The radio frequency IC device according to claim 1, wherein a frequency of a signal transmitted and received by the radiation plate in a state in which the annular electrode and the radiation plate are coupled to each other is higher than a resonant frequency of the annular electrode and lower than a resonant frequency of the radiation plate.

7. The radio frequency IC device according to claim 1, wherein the annular electrode and the radiation plate are arranged such that a magnetic field generated around the annular electrode is perpendicular or substantially perpendicular to an electric field generated around the radiation plate.

8. The radio frequency IC device according to claim 1, wherein the annular electrode is electrically connected to the radiation plate.

9. The radio frequency IC device according to claim 1, wherein a portion of the annular electrode is arranged in close proximity to the radiation plate.

10. The radio frequency IC device according to claim 1, wherein the annular electrode and the radiation plate are located on the same base.

11. The radio frequency IC device according to claim 1, wherein the radiation plate includes wide portions at both ends thereof, the wide portions being wider than a line width of a center portion in a longitudinal direction of the radiation plate.

12. The radio frequency IC device according to claim 11, wherein each of the wide portions includes an empty space.

13. The radio frequency IC device according to claim 1, wherein the pair of end portions of the annular electrode is arranged at an inside of the annular electrode.

14. The radio frequency IC device according to claim 1, wherein a frequency of a signal transmitted and received by the radiation plate is substantially determined by a resonant frequency of the resonant circuit.

15. The radio frequency IC device according to claim 4, wherein the feed circuit board is a ceramic or resin multilayer board.

16. A radio frequency IC device comprising:
a radio IC;
a magnetic-field radiation plate coupled to the radio IC and including at least a pair of end portions, the magnetic-field radiation plate communicates data of the radio IC using a resonant frequency of the magnetic-field radiation plate; and
an electric-field radiation plate coupled to the magnetic-field radiation plate, the electric-field radiation plate communicates data of the radio IC using a resonant frequency of the electric-field radiation plate; wherein
the resonant frequency of the magnetic-field radiation plate is lower than the resonant frequency of the electric-field radiation plate.

17. A radio frequency IC device comprising:
a radio IC;
an interposer coupled to the radio IC and including a line electrode located on at least one principal surface of a base and/or inside the base;
a magnetic-field radiation plate including at least a pair of end portions, the magnetic-field radiation plate communicates data of the radio IC using a resonant frequency of the magnetic-field radiation plate; and
an electric-field radiation plate coupled to the magnetic-field radiation plate, the electric-field radiation plate communicates data of the radio IC using a resonant frequency of the electric-field radiation plate; wherein
the line electrode is coupled to at least one of the magnetic-field radiation plate and the electric-field radiation plate; wherein
the resonant frequency of the magnetic-field radiation plate is lower than the resonant frequency of the electric-field radiation plate.

18. A radio frequency IC device comprising:
a radio IC;
a feed circuit coupled to the radio IC, and including a resonant circuit including an inductance element and having a predetermined resonant frequency;
a magnetic-field radiation plate including at least a pair of end portions and electromagnetically coupled to the feed circuit at the pair of end portions, the magnetic-field radiation plate communicates data of the radio IC using a resonant frequency of the magnetic-field radiation plate; and
an electric-field radiation plate coupled to the magnetic-field radiation plate, the electric-field radiation plate communicates data of the radio IC using a resonant frequency of the electric-field radiation plate; wherein
the resonant frequency of the magnetic-field radiation plate is lower than the resonant frequency of the electric-field radiation plate.

19. The radio frequency IC device according to claim 18, wherein the feed circuit is located on the feed circuit board; and
the radio IC and the feed circuit board constitute an electromagnetic coupling module.

20. The radio frequency IC device according to claim 16, wherein the magnetic-field radiation plate includes an annular electrode, and the electric-field radiation plate includes a dipole radiation plate.

21. The radio frequency IC device according to claim 16, wherein a resonant frequency of the magnetic-field radiation plate alone is higher than a resonant frequency of the resonant circuit and lower than a resonant frequency of the electric-field radiation plate alone.

22. The radio frequency IC device according to claim 16, wherein a frequency of a signal transmitted and received by the electric-field radiation plate in a state where the magnetic-field radiation plate and the electric-field radiation plate are coupled to each other is higher than a resonant frequency of the magnetic-field radiation plate and lower than a resonant frequency of the electric-field radiation plate.

23. The radio frequency IC device according to claim 16, wherein the magnetic-field radiation plate and the electric-field radiation plate are arranged such that a magnetic field generated around the magnetic-field radiation plate is perpendicular or substantially perpendicular to an electric field generated around the electric-field radiation plate.

24. The radio frequency IC device according to claim 16, wherein the magnetic-field radiation plate is electrically connected to the electric-field radiation plate.

25. The radio frequency IC device according to claim 16, wherein a portion of the magnetic-field radiation plate is arranged in close proximity to the electric-field radiation plate.

26. The radio frequency IC device according to claim 16, wherein the magnetic-field radiation plate and the electric-field radiation plate are located on the same base.

27. The radio frequency IC device according to claim 16, wherein the electric-field radiation plate includes wide portions at both ends thereof, the wide portions being wider than a line width of a center portion in a longitudinal direction of the electric-field radiation plate.

28. The radio frequency IC device according to claim 27, wherein each of the wide portions includes an empty space.

29. The radio frequency IC device according to any one of claim 16, wherein the pair of end portions of the magnetic-field radiation plate is arranged at an inside of the magnetic-field radiation plate.

30. The radio frequency IC device according to claim 16, wherein a frequency of a signal transmitted and received by the electric-field radiation plate is substantially determined by a resonant frequency of the resonant circuit.

31. The radio frequency IC device according to claim 19, wherein the feed circuit board is a ceramic or resin multilayer board.

32. A radio communication system comprising a radio frequency IC device according to claim 1, and a reader/writer configured to communicate with the radio frequency IC device, wherein the reader/writer includes a magnetic-field radiation plate including an annular electrode.

* * * * *